US006989688B2

(12) United States Patent
Ting

(10) Patent No.: US 6,989,688 B2
(45) Date of Patent: Jan. 24, 2006

(54) ARCHITECTURE AND INTERCONNECT SCHEME FOR PROGRAMMABLE LOGIC CIRCUITS

(75) Inventor: Benjamin S. Ting, Saratoga, CA (US)

(73) Assignee: BTR, Inc., Reno, NV (US)

( * ) Notice: Subject to any disclaimer, the term of this patent is extended or adjusted under 35 U.S.C. 154(b) by 45 days.

(21) Appl. No.: 10/829,527

(22) Filed: Apr. 21, 2004

(65) Prior Publication Data

US 2004/0196066 A1    Oct. 7, 2004

Related U.S. Application Data

(63) Continuation of application No. 10/428,724, filed on May 1, 2003, now Pat. No. 6,747,482, which is a continuation of application No. 10/117,875, filed on Apr. 5, 2002, now Pat. No. 6,597,196, which is a continuation of application No. 09/482,149, filed on Jan. 12, 2000, now Pat. No. 6,462,578, which is a continuation of application No. 08/909,928, filed on Aug. 12, 1997, now Pat. No. 6,051,991, which is a continuation of application No. 08/534,500, filed on Sep. 27, 1995, now abandoned, which is a continuation of application No. 08/229,923, filed on Apr. 14, 1994, now abandoned, which is a continuation-in-part of application No. 08/101,197, filed on Aug. 3, 1993, now Pat. No. 5,457,410.

(51) Int. Cl.
    *H03K 19/177*    (2006.01)

(52) U.S. Cl. .............................. 326/41; 326/38; 326/47

(58) Field of Classification Search ................... 326/41
    See application file for complete search history.

(56) References Cited

U.S. PATENT DOCUMENTS

| | | |
|---|---|---|
| 4,020,469 A | 4/1977 | Manning |
| 4,661,901 A | 4/1987 | Veneski |
| 4,700,187 A | 10/1987 | Furtek |
| 4,720,780 A | 1/1988 | Dolecek |
| 4,736,333 A | 4/1988 | Mead et al. |
| 4,758,745 A | 7/1988 | Elgamal |

(Continued)

FOREIGN PATENT DOCUMENTS

EP    0415542    3/1991

(Continued)

OTHER PUBLICATIONS

Cliff, et al., "A Dual Granularity and Globally Interconnected Architecture for A Programmable Logic Device", Sep. 5, 1993, IEEE,pp. 7.3.1-7.3.5.

(Continued)

*Primary Examiner*—Vibol Tan
(74) *Attorney, Agent, or Firm*—Blakely Sokoloff Taylor & Zafman LLP

(57) ABSTRACT

An architecture and distributed hierarchical interconnect scheme for field programmable gate arrays (FPGAs). The FPGA is comprised of a number of cells that perform logical functions on input signals. A set of block connectors are used to provide connectability between cells and accessibility to a hierarchical routing network. Uniformly distributed layers of routing network lines are used to provide connections. Switching networks provide connectability between the routing network lines. Additional uniformly distributed layers of routing network lines are implemented to provide connectability between different prior layers of routing network lines. Programmable bi-directional passgates are used as switches to control which of the routing network lines are to be connected.

42 Claims, 22 Drawing Sheets

U.S. PATENT DOCUMENTS

| | | |
|---|---|---|
| 4,815,003 A | 3/1989 | Putatunda et al. |
| 4,847,612 A | 7/1989 | Kaplinsky |
| 4,870,302 A | 9/1989 | Freeman |
| 4,912,342 A | 3/1990 | Wong et al. |
| 4,918,440 A | 4/1990 | Furtek |
| 4,935,734 A | 6/1990 | Austin |
| 4,992,680 A | 2/1991 | Benedetti et al. |
| 5,122,685 A | 6/1992 | Chan |
| 5,144,166 A | 9/1992 | Camarota et al. |
| 5,187,393 A | 2/1993 | Elgamal et al. |
| 5,204,556 A | 4/1993 | Shankar |
| 5,208,491 A | 5/1993 | Ebeling et al. |
| 5,221,865 A | 6/1993 | Phillips et al. |
| RE34,363 E | 8/1993 | Freeman |
| 5,243,238 A | 9/1993 | Kean |
| 5,256,918 A | 10/1993 | Suzuki |
| 5,260,610 A | 11/1993 | Pederson et al. |
| 5,260,611 A | 11/1993 | Cliff et al. |
| 5,296,759 A | 3/1994 | Sutherland et al. |
| 5,298,805 A | 3/1994 | Garverick et al. |
| 5,329,470 A | 7/1994 | Sample et al. |
| 5,349,691 A | 9/1994 | Harrison et al. |
| 5,369,314 A | 11/1994 | Patel et al. |
| 5,376,844 A | 12/1994 | Pederson et al. |
| 5,396,126 A | 3/1995 | Britton et al. |
| 5,406,525 A | 4/1995 | Nicholes |
| 5,444,394 A | 8/1995 | Watson et al. |
| 5,455,525 A | 10/1995 | Ho et al. |
| 5,457,410 A | 10/1995 | Ting |
| 5,469,003 A | 11/1995 | Kean |
| 5,477,067 A | 12/1995 | Isomura et al. |
| 5,485,103 A | 1/1996 | Pederson et al. |
| 5,519,629 A | 5/1996 | Snider |
| 5,550,782 A | 8/1996 | Cliff et al. |
| 5,552,722 A | 9/1996 | Kean |
| 5,572,148 A | 11/1996 | Lytle et al. |
| 5,581,199 A | 12/1996 | Pierce et al. |
| 5,581,767 A | 12/1996 | Katuski et al. |
| 5,598,109 A * | 1/1997 | Leong et al. ............... 326/41 |
| 5,656,950 A * | 8/1997 | Duong et al. ............... 326/41 |
| 5,835,405 A | 11/1998 | Tsui et al. |
| 5,850,564 A | 12/1998 | Ting et al. |
| 5,880,597 A * | 3/1999 | Lee ............................ 326/41 |
| 5,903,165 A | 5/1999 | Jones et al. |
| 6,016,063 A | 1/2000 | Trimberger |
| 6,034,547 A | 3/2000 | Pani et al. |
| 6,038,627 A | 3/2000 | Plants |
| 6,051,991 A | 4/2000 | Ting |
| 6,088,526 A | 7/2000 | Ting et al. |
| 6,160,420 A | 12/2000 | Gamal |
| 6,433,580 B1 | 8/2002 | Ting |
| 6,525,563 B2 * | 2/2003 | Hamano et al. ............ 326/41 |
| 6,686,768 B2 * | 2/2004 | Comer ....................... 326/38 |

FOREIGN PATENT DOCUMENTS

| | | |
|---|---|---|
| EP | 0630115 A2 | 6/1994 |
| GB | 2180382 | 3/1987 |
| GB | 2295738 | 5/1996 |
| WO | 9208286 | 5/1992 |
| WO | 9410754 | 5/1994 |
| WO | 9428475 | 12/1994 |
| WO | 9504404 | 2/1995 |
| WO | 9605964 | 4/1996 |
| WO | 9635261 | 11/1996 |

OTHER PUBLICATIONS

Britton, et al., "Optimized Reconfigurable Cell Array Architecture for High-Performance Field Programmable Gate Arrays," Proceedings of the IEEE 1993 Custom Integrated Circuits Conference, 1993, pp. 7.2.1-7.2.5, no month.

Xilinx, "The Programmable Gate Array Data Book", 1992, no month.

Minnick, R.C., "A Survey of Microcellular Research", vol. 14, No. 2, Apr. 1967, pp. 203-241.

Shoup, R. G., "Programmable Cellular Logic Arrays," Abstract, Ph.D. Dissertation, Carnegie Mellon University, Pittsburgh, PA, Mar. 1970, (partial) pp. ii-121.

Spandorfer, L.M., "Synthesis of Logic Functions on an Array of Integrated Circuits," Contract No. AF 19 (628) 2907, Project No. 4645, Task No. 464504, Final Report, Nov. 30, 1965.

Wang, P. et al. IEEE, "A High Performance FPGA with Hierarchical Interconnection Structure", pp. 239-242 (May 30, 1994).

ATMEL Field Programmable Arrays, AT 6000 Series, 1993, p. 1-16, no month.

Motorola Project Brief, "MPA10xx Field Programmable Gate Arrays," Sep. 27, 1993, 4 pages.

Altera Corporation Date Sheet, Flex EPF81188 12,000 Gate Programmable Logic Device, Sep. 1992, Ver. 1, pp. 1-20.

Sinan Kaptanoglu, Greg Bakker, Arun Kundu, Ivan Corneillet, Ben Ting, "A New High Density and Very Low Cost Reprogrammable FPGA Architecture", 10 pages, Actel Corporation, no date.

Buffoli, E., et al., "Dynamically Reconfigurable Devices Used to Implement a Self-Tuning, High Performances PID Controller," 1989 IEEE, pp., 107-112, no month.

Devades, S., et al., "Boolean Decomposition of Programmable Logic Arrays," IEEE 1988, pp. 2.5.1-2.5.5, no month.

Vidal, J.J., "Implementing Neural Nets with Programmable Logic," IEEE Transactions on Acoustic, Speech, and Signal Processing, vol. 36, No. 7, Jul. 1988, pp. 1180-1190.

Liu, D.L., et al., "Design of Large Embedded CMOS PLA's for Built-In Self-test," IEEE Transactions on Computed-Aided Design, vol. 7, No. 1, Jan. 1988, pp. 50-53.

Sun, Y., et al., "An Area Minimizer for Floorplans with L-Shaped Regions," 1992 International Conference on Computer Design, 1992 IEEE, pp. 383-386, no month.

Bursky, D., "Fine-Grain FPGA Architecture Uses Four Levels of Configuration Hierarchy," 2328 Electronic Design, 41, No. 20, Cleveland, OH, Oct. 1, 1993, pp. 33-34.

F. Zlotnick, P. Butler, W. Li, D. Tang, "A High Performance Fine-Grained Approach to SRAM Based FPGAs", p. 321-326, Wescon Sep. 28-30, 1993.

Robert H. Krambeck, "ORCA: A High Performance, Easy to Use SRAM Based Architecture", p. 310-320, Wescon Sep. 28-30, 1993.

* cited by examiner

○ Turn Point

ARCHITECTURE AND INTERCONNECT SCHEME FOR PROGRAMMABLE LOGIC CIRCUITS

REFERENCE TO RELATED APPLICATIONS

This application is a continuation of application Ser. No. 10/428,724 filed May 1, 2003 now U.S. Pat. No. 6,747,482, which is a continuation of application Ser. No. 10/117,875 filed Apr. 5, 2002, U.S. Pat. No. 6,597,196, which is a continuation of application Ser. No. 09/482,149 filed Jan. 12, 2000, U.S. Pat. No. 6,462,578, which is a continuation of application Ser. No. 08/909,928 filed Aug. 12, 1997, U.S. Pat. No. 6,051,991, which is a continuation of application Ser. No. 08/534,500 filed Sep. 27, 1995, abandoned, which is a continuation of application Ser. No. 08/229,923 filed Apr. 14, 1994, abandoned, which is a continuation-in-part of application Ser. No. 08/101,197 filed Aug. 3, 1993, U.S. Pat. No. 5,457,410.

FIELD OF THE INVENTION

The present invention pertains to the field of programmable logic circuits. More particularly, the present invention relates to an architecture and interconnect scheme for programmable logic circuits.

BACKGROUND OF THE INVENTION

When integrated circuits (ICs) were first introduced, they were extremely expensive and were limited in their functionality. Rapid strides in semiconductor technology have vastly reduced the cost while simultaneously increased the performance of IC chips. However, the design, layout, and fabrication process for a dedicated, custom built IC remains quite costly. This is especially true for those instances where only a small quantity of a custom designed IC is to be manufactured. Moreover, the turn-around time (i.e., the time from initial design to a finished product) can frequently be quite lengthy, especially for complex circuit designs. For electronic and computer products, it is critical to be the first to market. Furthermore, for custom ICs, it is rather difficult to effect changes to the initial design. It takes time, effort, and money to make any necessary changes.

In view of the shortcomings associated with custom IC's, field programmable gate arrays (FPGAs) offer an attractive solution in many instances. Basically, FPGAs are standard, high-density, off-the-shelf ICs which can be programmed by the user to a desired configuration. Circuit designers first define the desired logic functions, and the FPGA is programmed to process the input signals accordingly. Thereby, FPGA implementations can be designed, verified, and revised in a quick and efficient manner. Depending on the logic density requirements and production volumes, FPGAs are superior alternatives in terms of cost and time-to-market.

A typical FPGA essentially consists of an outer ring of I/O blocks surrounding an interior matrix of configurable logic blocks. The I/O blocks residing on the periphery of an FPGA are user programmable, such that each block can be programmed independently to be an input or an output and can also be tri-statable. Each logic block typically contains programmable combinatorial logic and storage registers. The combinatorial logic is used to perform boolean functions on its input variables. Often, the registers are loaded directly from a logic block input, or they can be loaded from the combinatorial logic.

Interconnect resources occupy the channels between the rows and columns of the matrix of logic blocks and also between the logic blocks and the I/O blocks. These interconnect resources provide the flexibility to control the interconnection between two designated points on the chip. Usually, a metal network of lines run horizontally and vertically in the rows and columns between the logic blocks. Programmable switches connect the inputs and outputs of the logic blocks and I/O blocks to these metal lines. Crosspoint switches and interchanges at the intersections of rows and columns are used to switch signals from one line to another. Often, long lines are used to run the entire length and/or breadth of the chip.

The functions of the I/O blocks, logic blocks, and their respective interconnections are all programmable. Typically, these functions are controlled by a configuration program stored in an on-chip memory. The configuration program is loaded automatically from an external memory upon power-up, on command, or programmed by a microprocessor as part of system initialization.

The concept of FPGA was summarized in the sixty's by Minnick who described the concept of cell and cellular array as reconfigurable devices in the following documents: Minnick, R. C. and Short, R. A., "Cellular Linear-Input Logic, Final Report," SRI Project 4122, Contract AF 19(628)-498, Stanford Research Institute, Menlo Park, Calif., AFCRL 64-6, DDC No. AD 433802 (February 1964); Minnick, R. C., "Cobweb Cellular Arrays," Proceedings AFIPS 1965 Fall Joint Computer Conference, Vol. 27, Part 1 pp. 327–341 (1965); Minnick, R. C. et al., "Cellular Logic, Final Report," SRI Project 5087, Contract AF 19(628)-4233, Stanford Research Institute, Menlo Park, Calif., AFCRL 66-613, (April 1966); and Minnick, R. C., "A Survey of Microcellular Research," Journal of the Association for Computing Machinery, Vol. 14, No. 2, pp. 203–241 (April 1967). In addition to memory based (e.g., RAM-based, fuse-based, or antifuse-based) means of enabling interconnects between devices, Minnick also discussed both direct connections between neighboring cells and use of busing as another routing technique. The article by Spandorfer, L. M., "Synthesis of Logic Function on an Array of Integrated Circuits," Stanford Research Institute, Menlo Park, Calif., Contract AF 19(628)2907, AFCRL 646, DDC No. AD 433802 (November 1965), discussed the use of complementary MOS bi-directional passgate as a means of switching between two interconnect lines that can be programmed through memory means and adjacent neighboring cell interconnections. In Wahlstrom, S. E., "Programmable Logic Arrays—Cheaper by the Millions," Electronics. Vol. 40, No. 25, 11, pp. 90–95 (December 1967), a RAM-based, reconfigurable logic array of a two-dimensional array of identical cells with both direct connections between adjacent cells and a network of data buses is described.

Shoup, R. G., "Programmable Cellular Logic Arrays," Ph.D. dissertation, Carnegie-Mellon University, Pittsburgh, Pa. (March 1970), discussed programmable cellular logic arrays and reiterates many of the same concepts and terminology of Minnick and recapitulates the array of Wahlstrom. In Shoup's thesis, the concept of neighbor connections extends from the simple 2-input 1-output nearest-neighbor connections to the 8-neighbor 2-way connections. Shoup further described use of bus as part of the interconnection structure to improve the power and flexibility of an array. Buses can be used to route signals over distances too long, or in inconvenient directions, for ordinary neighbor connections. This is particularly useful in passing inputs and outputs from outside the array to interior cells.

U.S. Pat. No. 4,020,469 discussed a programmable logic array that can program, test, and repair itself. U.S. Pat. No. 4,870,302 introduced a coarse grain architecture without use of neighbor direct interconnections where all the programmed connections are through the use of three different sets of buses in a channeled architecture. The coarse grain cell (called a Configurable Logical block or CLB) contains both RAM-based logic table look up combinational logic and flip flops inside the CLB where a user defined logic must be mapped into the functions available inside the CLB. U.S. Pat. No. 4,935,734 introduced a simple logic function cell defined as a NAND, NOR or similar types of simple logic function inside each cell. The interconnection scheme is through direct neighbor and directional bus connections. U.S. Pat. Nos. 4,700,187 and 4,918,440 defined a more complex logic function cell where an Exclusive OR and AND functions and a register bit is available and selectable within the cell. The preferred connection scheme is through direct neighbor connections. Use of bi-direction buses as connections were also included.

Current FPGA technology has a few shortcomings. These problems are embodied by the low level of circuit utilization given the vast number of transistors available on chip provided by the manufacturers. Circuit utilization is influenced by three factors. The first one at the transistor or fine grain cell level is the function and flexibility of the basic logic element that can be readily used by the users. The second one is the ease in which to form meaningful macro logic functions using the first logic elements with minimum waste of circuit area. The last factor is the interconnections of those macro logic functions to implement chip level design efficiently. The fine grained cell architectures such as those described above, provided easily usable and flexible logical functions for designers at the base logic element level.

However, for dense and complex macro functions and chip level routing, the interconnection resources required to connect a large number of signals from output of a cell to the input(s) of other cells can be quickly exhausted, and adding these resources can be very expensive in terms of silicon area. As a consequence, in fine grained architecture design, most of the cells are either left unused due to inaccessibility, or the cells are used as interconnect wires instead of logic. This adds greatly to routing delays in addition to low logic utilization, or excessive amount of routing resources are added, greatly increasing the circuit size. The coarse grain architecture coupled with extensive routing buses allows significant improvements for signals connecting outputs of a CLB to inputs of other CLBs. The utilization at the CLB interconnect level is high. However, the difficulty is the partitioning and mapping of complex logic functions so as to exactly fit into the CLBs. If a part of logic inside the CLB is left unused, then the utilization (effective number of gates per unit area used) inside the CLB can be low.

Another problem with prior art FPGAs is due to the fact that typically a fixed number of inputs and a fixed number of outputs are provided for each logic block. If, by happenstance, all the outputs of a particular logic block is used up, then the rest of that logic block becomes useless.

Therefore, there is a need in prior art FPGAs for a new architecture that will maximize the utilization of an FPGA while minimizing any impact on the die size. The new architecture should provide flexibility in the lowest logic element level in terms of functionality and flexibility of use by users, high density per unit area functionality at the macro level where users can readily form complex logic functions with the base logic elements, and finally high percentage of interconnectability with a hierarchical, uniformly distributed routing network for signals connecting macros and base logic elements at the chip level. Furthermore, the new architecture should provide users with the flexibility of having the number of inputs and outputs for individual logical block be selectable and programmable, and a scalable architecture to accommodate a range of FPGA sizes.

SUMMARY OF THE INVENTION

The present invention relates to an architecture of logic and connection scheme for programmable logic circuits, such as those for field programmable gate arrays (FPGAs). The programmable logic circuit is comprised of a number of cells which perform digital functions on input signals. Depending on user's specific design, certain cells are programmably interconnected to a particular configuration for realizing the desired logic functions.

In the currently preferred embodiment, four logic cells (four two-input one-output logic gates and one D flip-flop) form a logical cluster (i.e. a 2×2 cell array) and four sets of clusters form a logical block (i.e. a 4×4 cell array). Within each cluster, there is a set of five intraconnection lines, called Intraconnection Matrix (I-Matrix), one associated with the output of each one of the four gates and the D flip-flop that is connectable to the input of the other cells. Within each logical block, the I-Matrix within each cluster can be extended to an adjacent cluster through a passgate to form connections within the logical block (to extend the intraconnection range). Inside each logical block, there is an associated set of access lines called Block Connectors (BCs). The block connectors provide access to and connectability between the various cells of that same logical block. In other words, each input and output of each of the cells of a logical block is capable of being connected to a set of block connectors corresponding to that logical block. With the judicious use of I-Matrix and block connectors within the same logical block, a set of signals can be internally connected without using any resources outside the logical block. A number of programmable switches are used to control which of the block connectors are to be connected together to a set of inputs and/or outputs of the cells inside the logical block for external access connecting to signals outside the current logical block. In other words, the input and/or output pins inside a logical block that are to be externally connected outside of the current logical block are accessed or connected through block connectors within the current logical block.

In order to route signals between the various logical blocks, a uniformly distributed multiple level architecture (MLA) routing network is used to provide connectability between each of the individual sets of block connectors. Programmable switches are implemented to control which of the first level MLA routing network lines are to be connected together. Additional programmable switches are used to control which of the block connectors are to be connected to specific first level HA routing lines. For example, the switches can be programmed to allow an originating cell belonging to one logical block to be connected to a destination cell belonging to a different logical block. This can be accomplished by connecting the originating cell through one or more of its block connectors, onto the first level MLA, depending on the distance, other level(s) of MLA, and down through descending levels of MLAs back to the first level MLA, and finally through the block connector of the destination cell. Thereby, the block connectors and first level of MLA routing network provide interconnectability for an 8×8 cell array, called a block cluster.

In the present invention, larger cell arrays can be interconnected by implementing additional levels of MLA routing networks. For example, connectability for a 16×16 cell array, called a block sector, can be achieved by implementing a second level of MLA routing network lines to provide connectability between the various first level of MLA routing lines thereby making connections between different block clusters. Each level of M has a corresponding number of switches for providing programmable interconnections of the routing network of that level. Additional switching exchange networks are used to provide connectability between the various levels of MLAs.

In one embodiment, switches are used to provide connectability between two different sets of block connectors. Moreover, switches can be included to provide connectability between different sets of MLA routing lines of a particular level of MLAs. This provides for increased routing flexibility.

In the present invention, all MLA routing network lines are bi-directional The switches are comprised of programmable bi-directional passgates. For increased number of levels, drivers may be necessary for providing the necessary switching speed for driving the routing lines, passgates, and associated loads, etc. In one embodiment, switches are used to provide programmable connectability amongst various sets of block connectors. Additional switches can be implemented to provide programmable connectability amongst various sets of the first level of MLA. This scheme can be repeated for higher levels of MLAs.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

An architecture and interconnect scheme for programmable logic circuits is described. In the following description, for purposes of explanation, numerous specific details are set forth, such as combinational logic, cell configuration, numbers of cells, etc., in order to provide a thorough understanding of the present invention. It will be obvious, however, to one skilled in the art that the present invention may be practiced without these specific details. In other instances, well-known structures and devices are shown in block diagram form in order to avoid unnecessarily obscuring the present invention. It should also be noted that the present invention pertains to a variety of processes including but not limited to static random access memory (SRAM), dynamic random access memory (DRAM), fuse, anti-fuse, erasable programmable read only memory (EPROM), electrically erasable programmable read only memory (EEPROM), FLASH, and ferroelectric processes.

Figure 1:
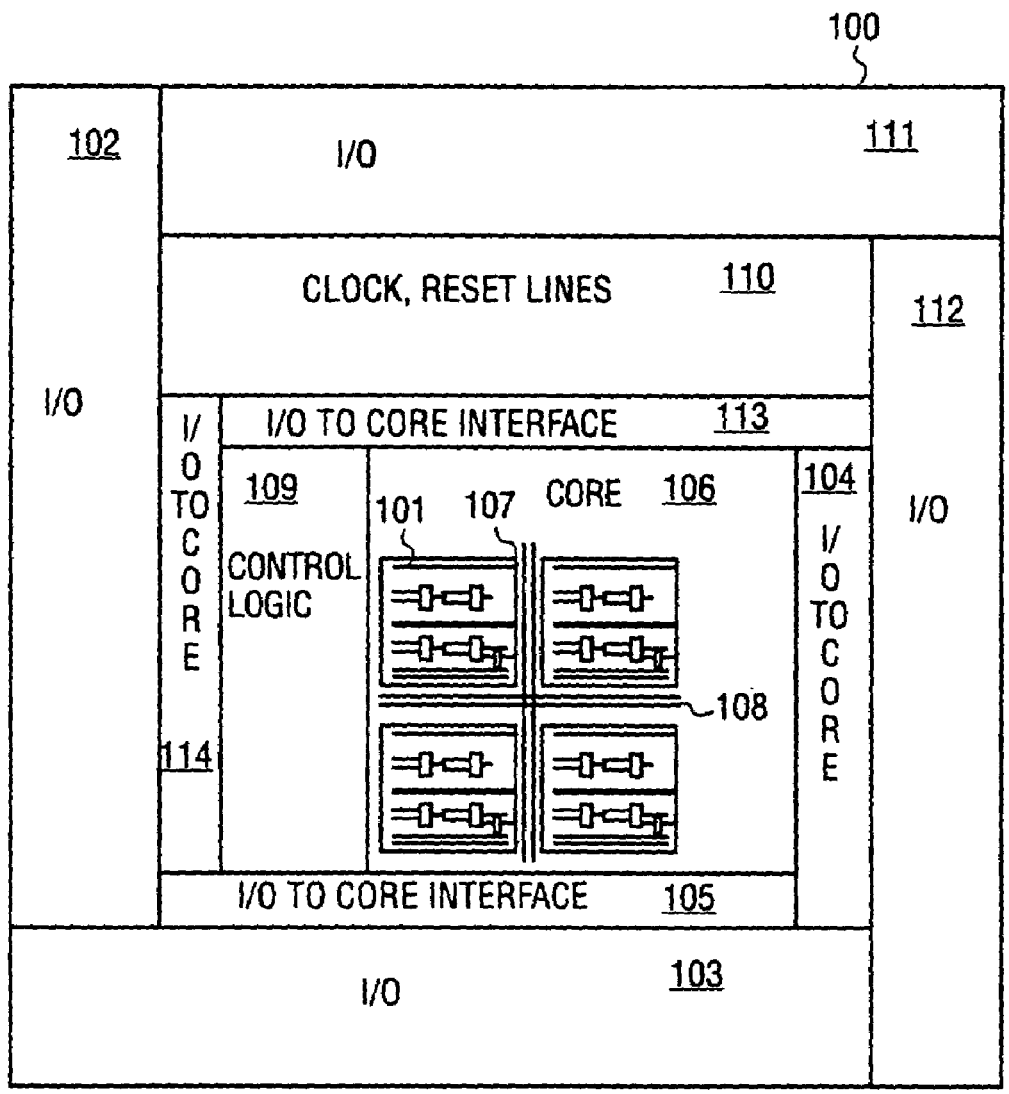
FIG. 1 is a block diagram of a field programmable gate array logic upon which the present invention may be practiced.

Referring to FIG. 1, a block diagram of a field programmable gate array logic upon which the present invention may be practiced is shown as 100. The I/O logical blocks 102, 103, 111 and 112 provide an interface between external package-pins of the FPGA and the internal user logic either directly or through the I/O to Core interface 104, 105, 113, and 114. Four interface blocks 104, 105, 113, and 114 provide decoupling between core 106 and the I/O logic 102, 103, 111, and 112. Core 106 is comprised of a number of clusters 107 which are intraconnected by I-Matrix 101 and interconnected by MLA routing network 108.

Control/programming logic 109 is used to control all of the bits for programming the bit and word lines. For antifuse or fuse technology, high voltage/current is applied to either zap or connect a fuse. For EEPROM, Flash, or ferroelectric technology, there is an erase cycle followed by a programming cycle for programming the logic states of the memory bits. In order to minimize skewing, a separate clock/reset logic 110 is used to provide clock and reset lines on a group basis.

Figure 2A:
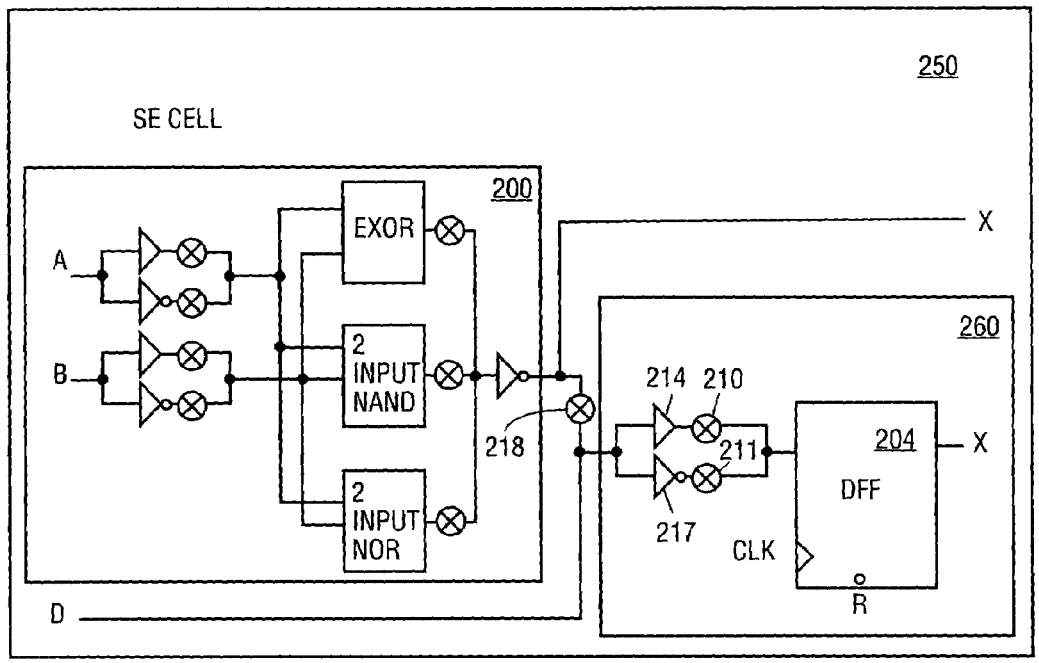
FIG. 2A shows one example of an individual cell.
Figure 2B:
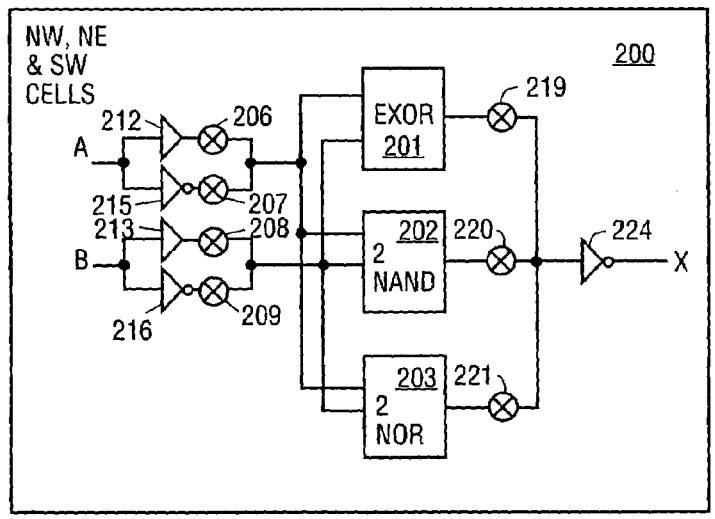
FIG. 2B shows another example of an individual cell.

In the currently preferred embodiment, each of the clusters 107 is comprised of a 2×2 hierarchy of four cells, called a logical cluster. FIGS. 2A and 2B show examples of individual cells 200 and 250. Cell 200 performs multiple logic functions on two input signals (A and B) and provides an output signal X. In the currently preferred embodiment, cell 200 is comprised of an XOR gate 201, a two-input NAND gate 202, and a two-input NOR gate 203. It should be noted, however, that in other embodiments, cell 200 can include various other types and/or combinations of gates. Cell 250 is comprised of cell 200 coupled with a D flip flop cell 260. The output X of cell 200 can be programmed to connect directly to the data input D of the D flip flop gate 204 by activating switch 218. The data input D can be accessed as a third input of the combined cell 250.

Each of the two input signals A and B and the D input of D flip-flop can be inverted or non-inverted, depending on the states of switches 206–211. Activating switches 206, 208 and 210 causes signals A, B and D to be driven by drivers 212–214 to gates 201–204 in a non-inverted fashion. Activating switches 207, 209, and 211 causes the input signals A, B and D to be inverted by inverters 215–217 before being passed to gates 201–204. The six switches 212–217 can individually be turned on and off as programmed by the user.

Note that the XOR gate 201, NAND gate 202, and NOR gate 203 can also be used to perform XNOR, AND and OR by propagating the output signal to the next stage, whereby the signal can be inverted as discussed above.

Three switches 219–221 are respectively coupled to the outputs of the three gates 201–203. Again, these switches are programmable by the user. Thereby, the user can specify which of the outputs from the gates 201–203 is to be sent to driver 224 as the output X from cell 200.

The aforementioned switches 206–211, 218–221 are comprised of bi-directional, program-controlled passgates. Depending on the state of the control signal, the switches are either conducting (i.e. passes a signal on the line) or non-conducting (i.e. Does not pass the signal on the line). Switches mentioned in the following sections are similarly comprised of program-controlled passgates.

Figure 3A:
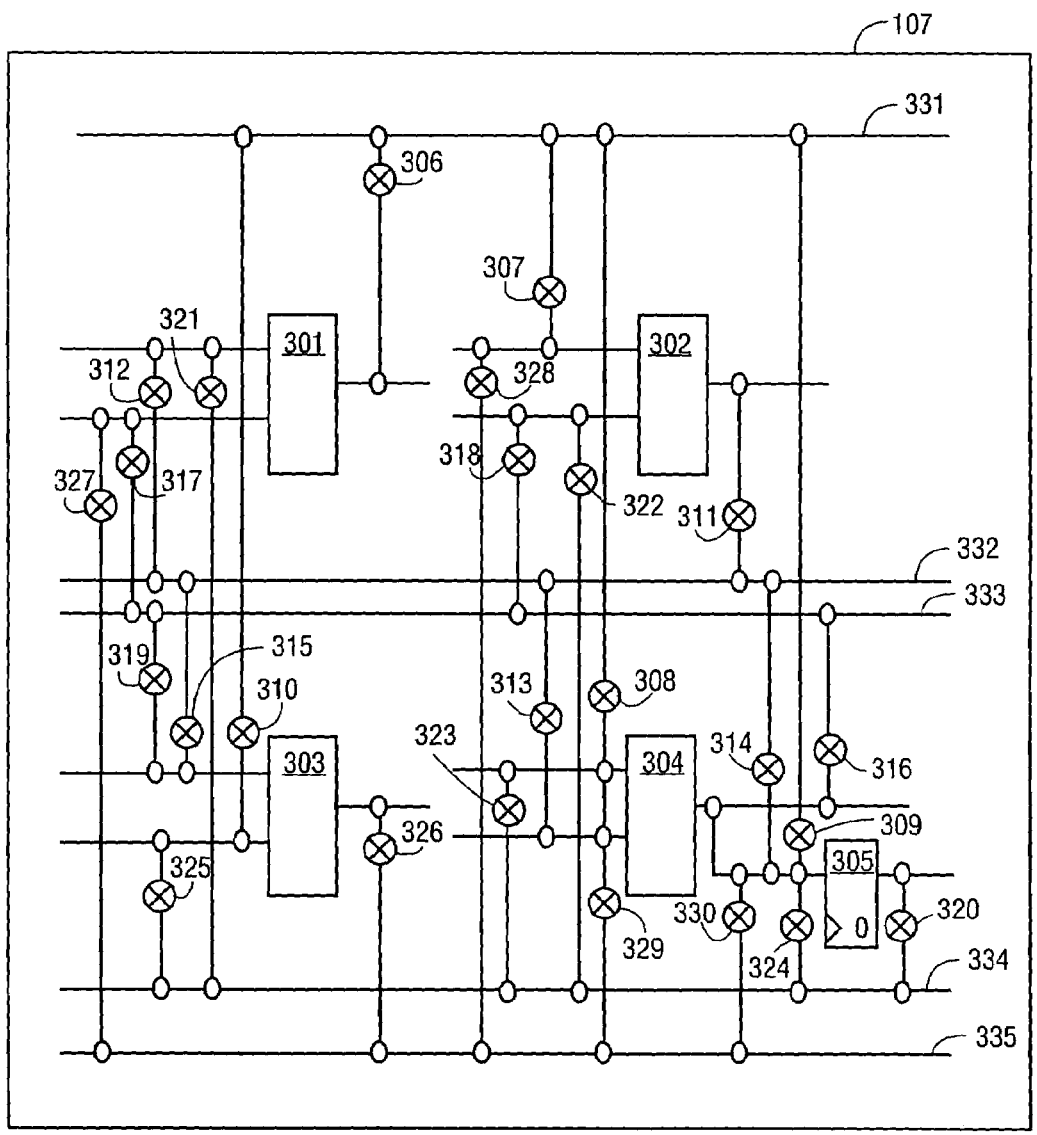
FIG. 3A shows a logical cluster.

Referring now to FIG. 3A, a logical cluster 107 is shown. In the currently preferred embodiment, logical cluster 107 is comprised of four cells 301–304 and a D flip-flop 305, twenty five switches 306–330, and five intraconnection lines 331–335. The Intraconnection lines 331–335 and switches 306–330 form the I-Matrix. I-Matrix provide connectability of the output, X, of each of the four cells 301–304, and the output X of the D flip-flop 305 to at least one input of each of the other three cells and the D flip-flop. For example, the output X of cell 301 can be connected to input A of cell 302 by enabling switches 306 and 307. Likewise, the output X of cell 301 can be connected to input B of cell 303 by enabling switches 306 and 310. Output X of cell 301 can be connected to input A of cell 304 by enabling switches 306 and 308. Output X of cell 301 can be connected to input D of the D flip-flop cell 305 by enabling switches 306 and 309.

Similarly, the output X from cell 302 can be connected to input A of cell 301 by enabling switches 311 and 312. The output X from cell 302 can be connected to input A of cell 303 by enabling switches 311 and 315. The output X from cell 302 can be connected to input B of cell 304 by enabling switches 311 and 313. Output X of cell 302 can be connected to input D of the D flip-flop cell 305 by enabling switches 311 and 314.

Similarly, the output X from cell 303 can be connected to input B of cell 301 by enabling switches 326 and 327. The output X from cell 303 can be connected to input A of cell 302 by enabling switches 326 and 328. The output X from cell 303 can be connected to input B of cell 304 by enabling switches 326 and 329. Output X of cell 303 can be connected to input D of the D flip-flop cell 305 by enabling switches 326 and 330.

For cell 304, the output X from cell 304 can be connected to input B of cell 301 by enabling switches 316 and 317. The output X from cell 304 can be connected to input B of cell 302 by enabling switches 316 and 318. The output X from cell 304 can be connected to input A of cell 303 by enabling switches 316 and 319. Output X of cell 304 can be programmably connected to input D of the D flip-flop cell 305 by enabling switch 218 in FIG. 2A.

With respect to cell 305, its output is connectable to the A input of cell 301 by enabling switches 320 and 321; the B input of cell 302 by enabling switches 320 and 322; the B input of cell 303 by enabling switches 320 and 325; the A input of cell 304-by enabling switches 320 and 323; and the D input of cell 305 itself by enabling switches 320 and 324.

It can be seen that each output of the cells 301–304 and of the D flip-flop 305 is connectable to the input of each of its neighboring cells and/or flip-flop inside the cluster.

Figure 3B:
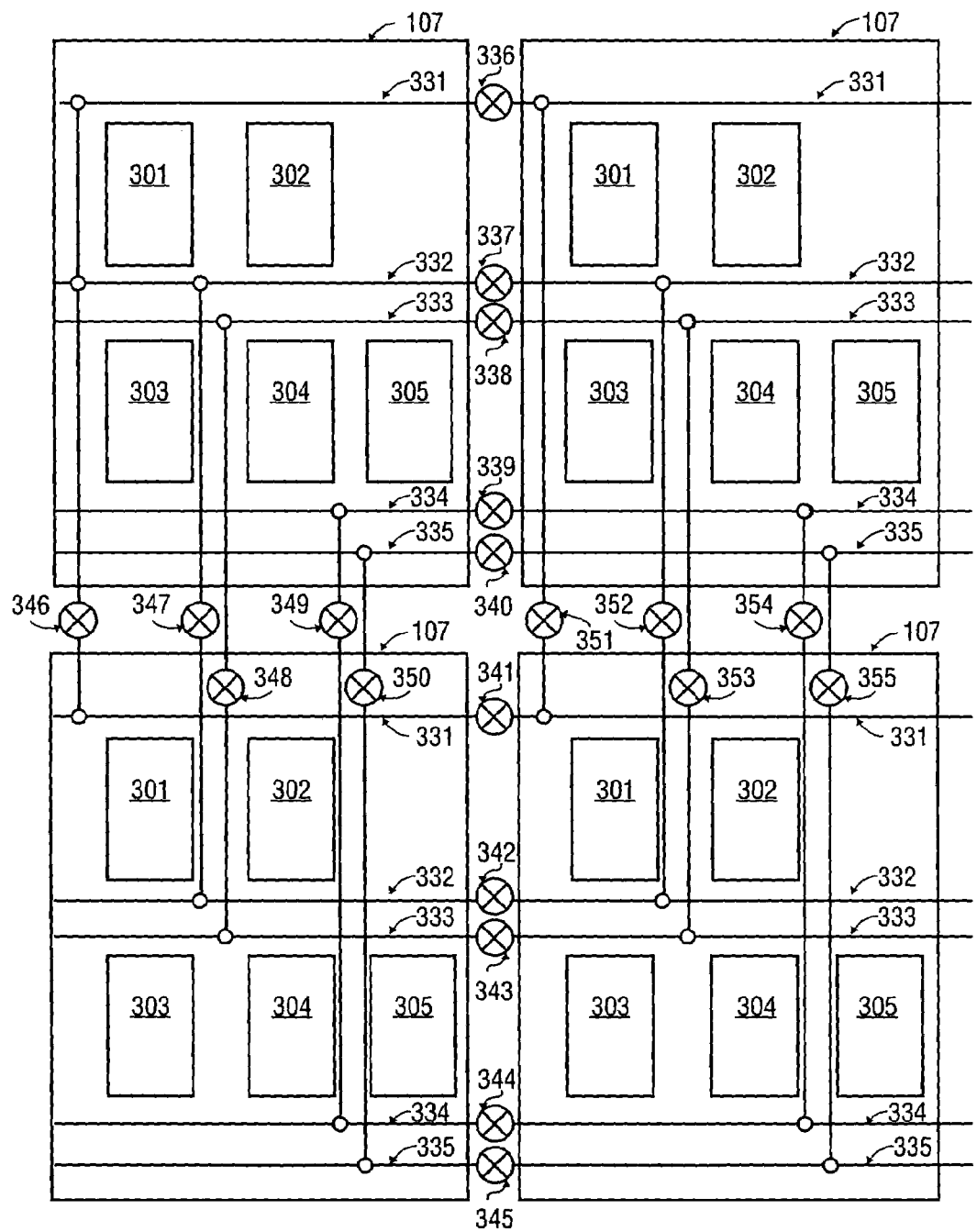
FIG. 3B shows the extension of I-matrix intraconnections of a logical cluster to a neighboring logical cluster.

In the currently preferred embodiment of the present invention, each logical cluster is connectable to all the other logical clusters inside each logical block through passgate switches extending the I-Matrix from neighboring clusters inside each logical block. FIG. 3B illustrates the extension of I-Matrix intraconnection lines 331–335 of the cells 301–304 and the D flip-flop 305 of a logical cluster 107 to a neighboring logical cluster 107 through the passgate switches 336–355 within the same logical block.

In the currently preferred embodiment of the present invention, each logical block is connectable to all the other logical blocks of the FPGA. This is accomplished by implementing an architecture with multiple layers of interconnections. It is important to note that this multiple layers routing architecture is a conceptual hierarchy, not a process or technology hierarchy and is hence readily implementable with today's silicon process technology. The bottom most layer of interconnections is referred to as the "block connectors". A set of block connectors provides the access and interconnections of signals within an associated logical block (which is consisted of four logical clusters or 16 cells). Thereby, different sets of logical clusters within the same logical block are connectable to any of the other logical clusters within that group through the use of extended I-Matrix and/or block connectors. Again, programmable bi-directional passgates are used as switches to provide routing flexibility to the user.

The next level of connections is referred to as the "level 1 Multiple Level Architecture (MLA)" routing network. The level 1 MLA routing network provides the interconnections between several sets of block connectors. Programmable passgates switches are used to provide users with the capability of selecting which of the block connectors are to be connected. Consequently, a first logical block from one set of logical block groups is connectable to a second logical block belonging to the same group. The appropriate switches are enabled to connect the block connectors of the first logical block to the routing lines of the level 1 MLA routing network. The appropriate switches of the level 1 MLA routing network are enabled to provide the connections to the block connectors of the second logical block to the routing lines of the level 1 MLA routing network. The appropriate switches are enabled to connect the routing lines of the level 1 MLA routing network that connected to the block connectors of the first and the second logical blocks. Furthermore, the user has the additional flexibility of programming the various switches within any given logical block to effect the desired intraconnections between each of the cells of any logical block.

The next level of connections is referred to as the "level 2 Multiple Level Architecture (MLA)" routing network. The level 2 MLA provides the interconnections to the various level 1 MLA to effect access and connections of a block cluster. Again, bi-directional passgate switches are programmed by the user to effect the desired connections. By implementing level 2 MLA routing network, programmable interconnections between even larger numbers of logical blocks is achieved.

Additional levels of MLA routing networks can be implemented to provide programmable interconnections for ever increasing numbers and groups of logical blocks, block clusters, block sectors, etc. Basically, the present invention takes a three dimensional approach for implementing routing. Signals are routed amongst the intraconnections of a logical block. These signals can then be accessed through block connectors and routed according to the programmed connections of the block connectors. If needed, signals are "elevated" to the level 1 MLA, routed through the level 1 MLA routing network, "de-elevated" to the appropriate block connectors, and then passed to the destination logical block.

If level 2 MLA routing network is required, some of the signals are elevated a second time from a level 1 MLA routing network line or directly to the level 2 MLA routing network, routed to a different set of level 2 MLA routing network line, and "de-elevated" from the level 2 MLA routing network line to a Level 1 MLA routing network line. Thereupon, the signals are "de-elevated" a second time to pass the signal from the level 1 MLA to the appropriate block connectors of the destination logical block. Alternatively, the "elevation" can be achieved directly without passing through the level 1 MLA routing network. This same approve is performed for level 3, 4, 5, etc., MLAs on an as needed basis, depending on the size and density of the FPGA. Partial level n MLA can be implemented using the above discussed method to implement a FPGA with a given cell array count.

Figure 4A:
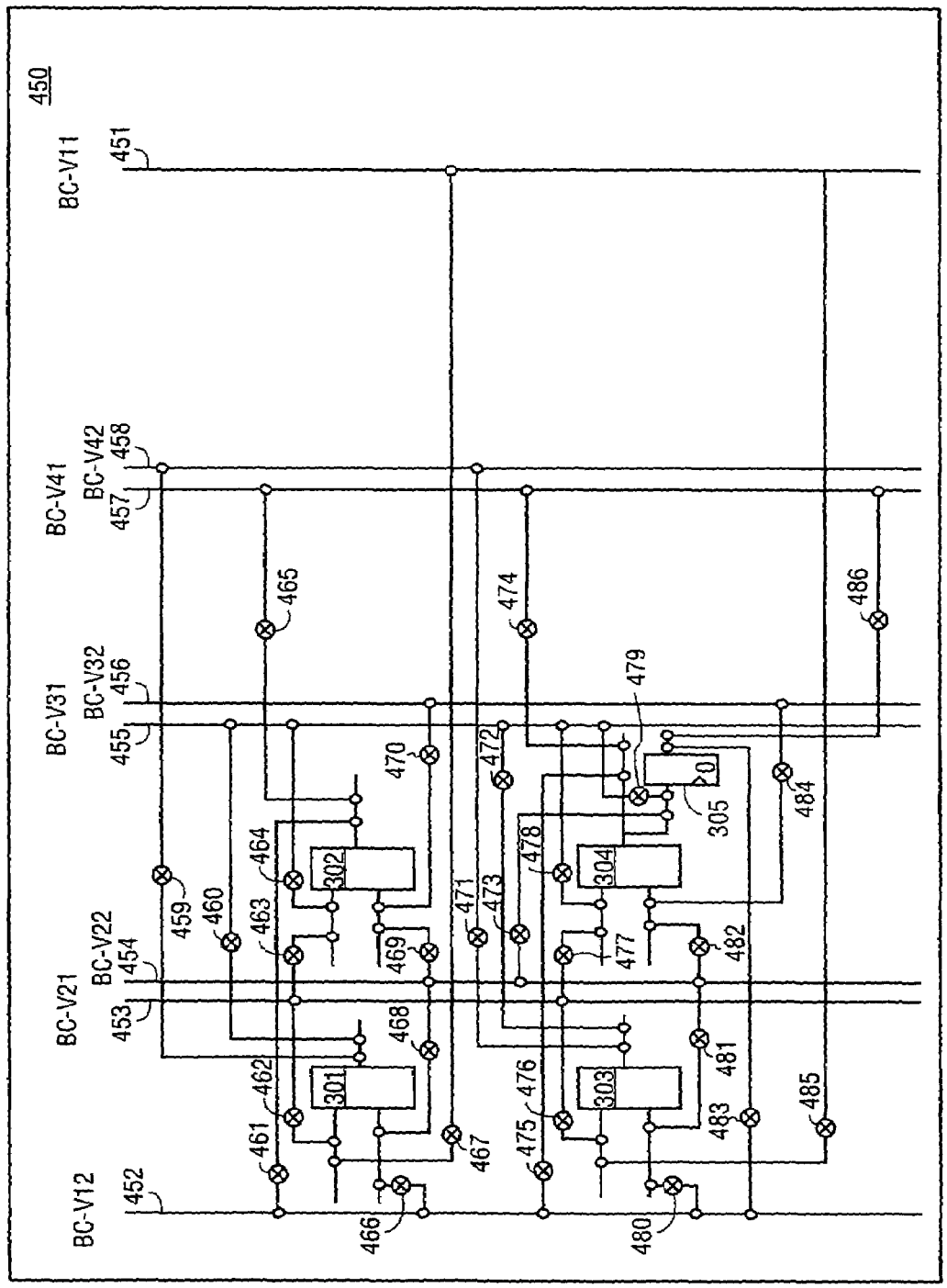
FIG. 4A shows an example of a logical cluster with vertical block connectors.

FIG. 4A shows an example of a logical cluster and the associated vertical block connectors within the logical block. In the currently preferred embodiment, each cell in a logical cluster is accessible from the input by two vertical block connectors and each output of the cell in a logical cluster is accessible to two of the vertical block connectors. For example, input A of cell 301 is accessible to the vertical block connectors 451 (BC-V11) and 453 (BC-V21) through switches 467, 462 respectively, input B of cell 301 is accessible to the vertical block connectors 452 (BC-V12) and 454 (BC-V22) through switches 466, 468 respectively, output X of cell 301 is accessible to the vertical block connectors 455 (BC-V31) and 458 (BC-V42) through switches 460, 459 respectively. Input A of cell 302 is accessible to the vertical block connectors 453 (BC-V21) and 455 (BC-V31) through switches 463, 464 respectively, input B of cell 302 is accessible to the vertical block connectors 454 (BC-V22) and 456 (BC-V32) through switches 469, 470 respectively, output X of cell 302 is accessible to the vertical block connectors 452 (BC-V12) and 457 (BC-V41) through switches 461, 465 respectively. Input A of cell 303 is accessible to the vertical block connectors 451 (BC-V11) and 453 (BC-V21) through switches 485, 476 respectively, input B of cell 303 is accessible to the vertical block connectors 452 (BC-V12) and 454 (BC-V22) through switches 480, 476 respectively, output X of cell 303 is accessible to the vertical block connectors 455 (BC-V31) and 458 (BC-V42) through switches 472, 471 respectively. The input A of cell 304 is accessible to the vertical block connectors 453 (BC-V21) and 455 (BC-V31) through switches 477, 478 respectively, input B of cell 304 is accessible to the vertical block connectors 454 (BC-V22) and 456 (BC-V32) through switches 482, 484 respectively, output X of cell 304 is accessible to the vertical block connectors 452 (BC-V12) and 457 (BC-V41) through switches 475, 474 respectively. D flip-flop cell 305 input is accessible to the vertical block connectors 454 (BC-V22) and 455 (BC-V31) through switches 473, 479 respectively, output X of cell 305 is accessible to the vertical block connectors 452 (BC-V12) and 457 (BC-V41) through switches 483, 486 respectively.

Figure 4B:
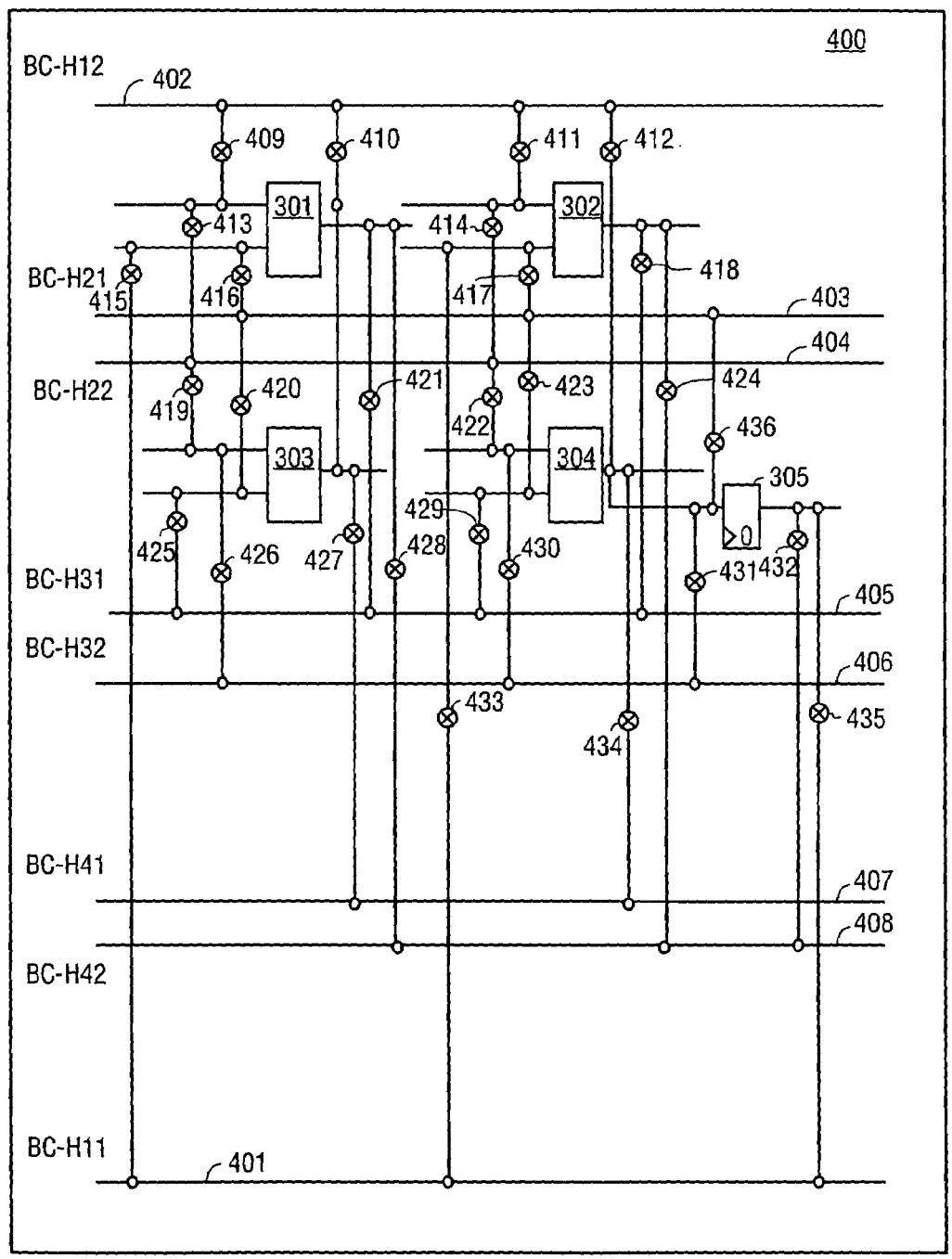
FIG. 4B shows an example of a logical cluster with horizontal block connectors.

In similar fashion, FIG. 4B shows the possible connections corresponding to horizontal block connectors and the logical cluster shown in FIG. 4A. Input A of cell 301 is accessible to the horizontal block connectors 402 (BC-H12) and 404 (BC-H22) through switches 409, 413 respectively, input B of cell 301 is accessible to the horizontal block connectors 401 (BC-H11) and 403 (BC-H21) through switches 415, 416 respectively, output X of cell 301 is accessible to the horizontal block connectors 405 (BC-H31) and 408 (BC-H42) through switches 421, 428 respectively. Input A of cell 302 is accessible to the horizontal block connectors 402 (BC-H12) and 404 (BC-H22) through switches 411, 414 respectively, input B of cell 302 is accessible to the horizontal block connectors 401 (BC-H11) and 403 (BC-H21) through switches 433, 417 respectively, output X of cell 302 is accessible to the horizontal block connectors 405 (BC-H31) and 408 (BC-H42) through switches 418, 424 respectively. Input A of cell 303 is accessible to the horizontal block connectors 404 (BC-H22) and 406 (BC-H32) through switches 419, 426 respectively, input B of cell 303 is accessible to the horizontal block connectors 403 (BC-H21) and 405 (BC-H31) through switches 420, 425 respectively, output X of cell 303 is accessible to the horizontal block connectors 402 (BC-H12) and 407 (BC-H41) through switches 410 427 respectively. The input A of cell 304 is accessible to the horizontal block connectors 404 (BC-H22) and 406 (BC-H32) through switches 422,430 respectively, input B of cell 304 is accessible to the horizontal block connectors 403 (BC-H21) and 405 (BC-H31) through switches 423, 429 respectively, output X of cell 304 is accessible to the horizontal block connectors 402 (BC-H12) and 407 (BC-H41) through switches 412, 434 respectively. D flip-flop cell 305 input is accessible to the horizontal block connectors 403 (BC-H21) and 406 (BC-H32) through switches 436, 431 respectively, output X of cell 305 is accessible to the horizontal block connectors 401 (BC-H11) and 408 (BC-H42) through switches 432, 435 respectively.

FIGS. 4A and 4B illustrate the vertical and horizontal block connectors accessing method to the upper left (NW) logical cluster inside a logical block in the currently preferred embodiment. The lower left (SW) cluster has the identical accessing method to the vertical block connectors as those of the NW cluster. The upper right (NE) cluster has similar accessing method to those of the NW cluster with respect to the vertical block connectors except the sequence of vertical block connector access is shifted. The vertical block connectors 451-458 can be viewed as chained together as a cylinder (451, 452, . . . , 458). Any shift, say by 4, forms a new sequence: (455, 456, 457, 458, 451, 452, 453, 454). Instead of starting with vertical block connectors 451 and 453 accessing by cell 301 in the NW cluster as illustrated in FIGS. 4A, the cell 301 in the NE cluster is accessible to VBCs 455 and 457. The numbering is "shifted" by four. The access labeling of the lower right (SE) cluster to the VBCs is identical to those of NE cluster.

Similarly, the horizontal block connectors access to the NW cluster is identical to those of the NE cluster and the SW cluster is identical to the SE cluster while the horizontal block connectors access to the SW cluster is shifted by four compared with those of NW cluster.

In the currently preferred embodiment, sixteen block connectors are used per logical block (i.e. four clusters, or a 4×4 cell array). Adding a level 1 MLA routing network allows for the connectability for a block cluster (an 8×8 cell array). Adding level 2 MLA routing network increases the connectability to a block sector (16×16 cell array). Additional levels of MLA routing network increases the number of block sectors by factors of four while the length (or reach) of each line in the MLA routing network increases by factors of two. The number of routing lines in the level 2 MLA is increased by a factor of two; since the number of block sectors increased by a factor of four, on a per unit area basis, the number of routing lines in the next level of hierarchy actually decreases by a factor of two.

Figure 5A:
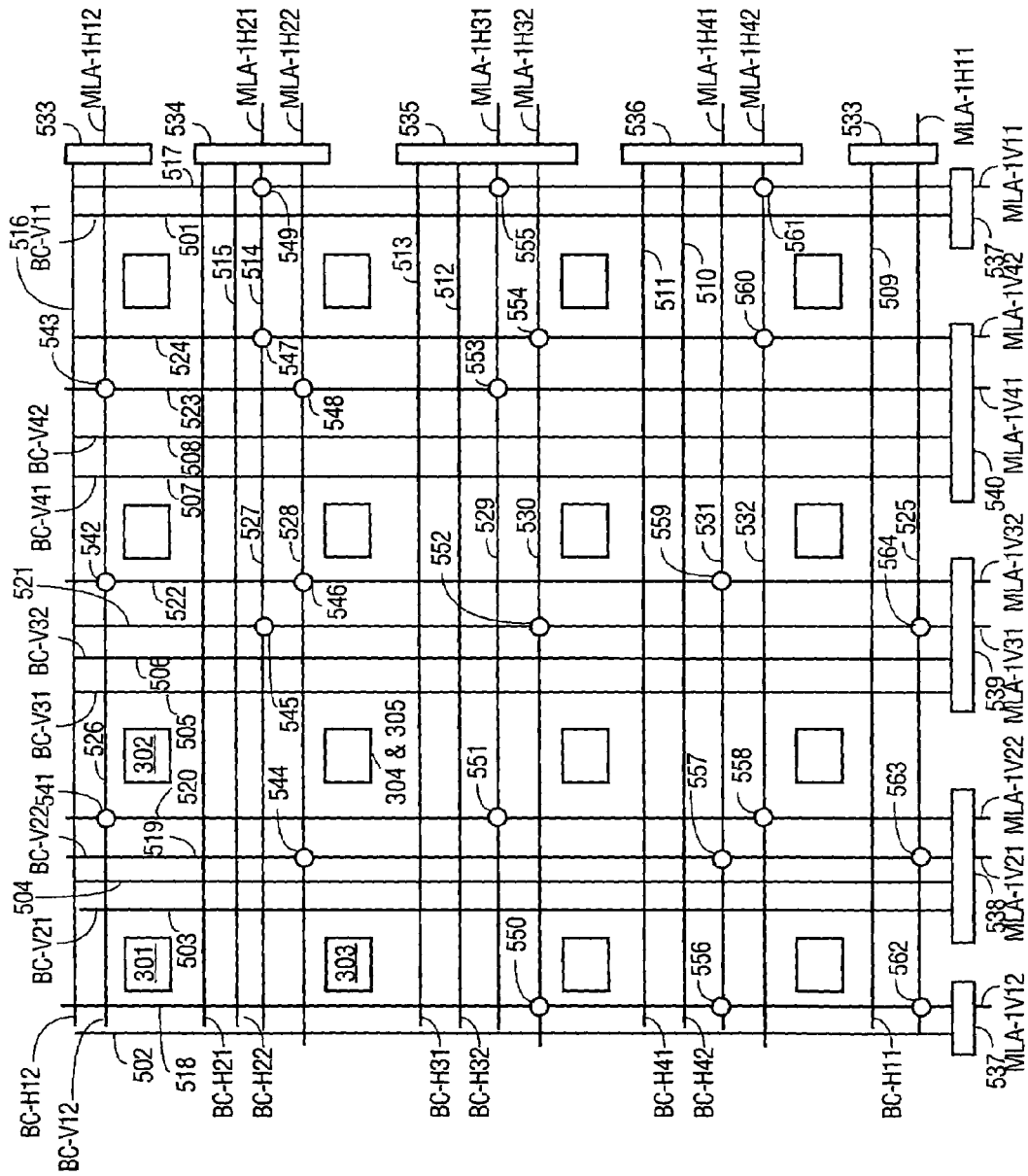
FIG. 5A shows the eight block connector to level 1 MLA exchange networks associated with a logical block and level 1 MLA turn points.

FIG. 5A shows a logical block with associated sixteen block connectors and level 1 MLA routing lines associated with the logical block. The sixteen block connectors 501–516 are depicted by heavy lines whereas the sixteen level 1 MLA routing network lines 517–532 are depicted by lighter lines. Note that the length or span of the block connectors terminates within the logical block while the length of the level 1 MLA routing network lines extends to neighboring logical blocks (twice the length of the block connectors).

Both block connectors and level 1 MLA routing network lines are subdivided into horizontal and vertical groups: vertical block connectors 501–508, horizontal block connectors 509–516, vertical level 1 MLA routing network lines 517–524, and horizontal level 1 MLA routing network lines 525–532.

Figure 5B:
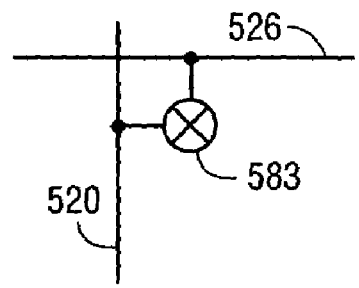
FIG. 5B shows a level 1 MLA turn point.

In the currently preferred embodiment, there are twenty four level 1 MLA turn points for the sixteen level 1 MLA routing network lines within the logical block. In FIG. 5A, the twenty four turn points are depicted as dear dots 541–564. A MLA turn point is a programmable bi-directional passgate for providing connectability between a horizontal MLA routing network line and a vertical MLA routing network line. For example, enabling level 1 MLA turn point 541 causes the horizontal level 1 MLA routing network line 526 and vertical level 1 MLA routing network line 520 to become connected together. FIG. 5B shows level 1 MLA turn point 541. Switch 583 controls whether level 1 MLA routing network line 526 is to be connected to level 1 MLA routing network line 520. If switch is enabled, then level 1 MLA routing network line 526 is connected to level 1 MLA routing network line 520. Otherwise, line 526 is not connected to line 520. Switch 583 is programmable by the user. The turn points are placed as pair-wise groups with the objective of providing switching access connecting two or more block connectors first through the block connector to level 1 MLA exchange networks and then connecting selected level 1 MLA routing lines by enabling the switches. The level 1 MLA lines are used to connect those block connectors that reside in separate logical blocks within the same block cluster.

Figure 5C:
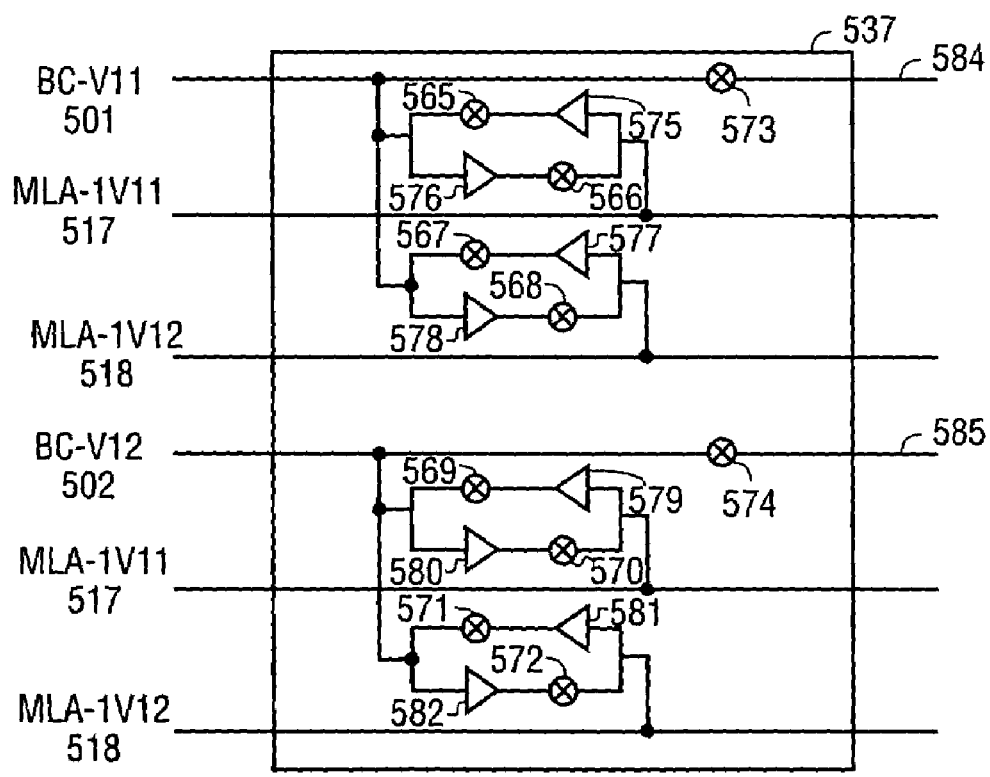
FIG. 5C shows an exchange network.

Referring back to FIG. 5A, there are eight block connector to level 1 MLA exchange networks 533–540 for each logical block. These exchange networks operate to connect certain block connectors to level 1 MLA line as programmed by the user. FIG. 5C shows the exchange network 537 in greater detail The block connector to level 1 MLA routing exchange network has eight drivers 575–582. These eight drivers 575–582 are used to provide bi-directional drive for the block connectors 501, 502 and level 1 MLA lines 517, 518. For example, enabling switch 565 causes the signal on block connector 501 to be driven by driver 575 from the level 1 MLA line 517. Enabling switch 566 causes the signal on level 1 MLA line 517 to be driven by driver 576 from the block connector 501. Enabling switch 567 causes the signal on block connector 501 to be driven by driver 577 from the level 1 MLA line 518. Enabling switch 568 causes the signal on level 1 MLA line 518 to be driven by driver 578 from the block connector 501.

Similarly, enabling switch 569 causes the signal on block connector 502 to be driven by driver 579 from the level 1 MLA line 517. Enabling switch 570 causes the signal on level 1 MLA line 517 to be driven by driver 580 from the block connector 502. Enabling switch 571 causes the signal on block connector 502 to be driven by driver 581 from the level 1 MLA line 518. Enabling switch 572 causes the signal on level 1 MLA line 518 to be driven by driver 582 from the block connector 502. Switch 573 is used to control whether a signal should pass form one block connector 501 to the adjacent block connector 584 belonging to the adjacent logical block.

Likewise, switch 574 is used to control whether a signal should pass form one block connector 502 to the adjacent block connector 585 belonging to the adjacent logical block.

Figure 6:
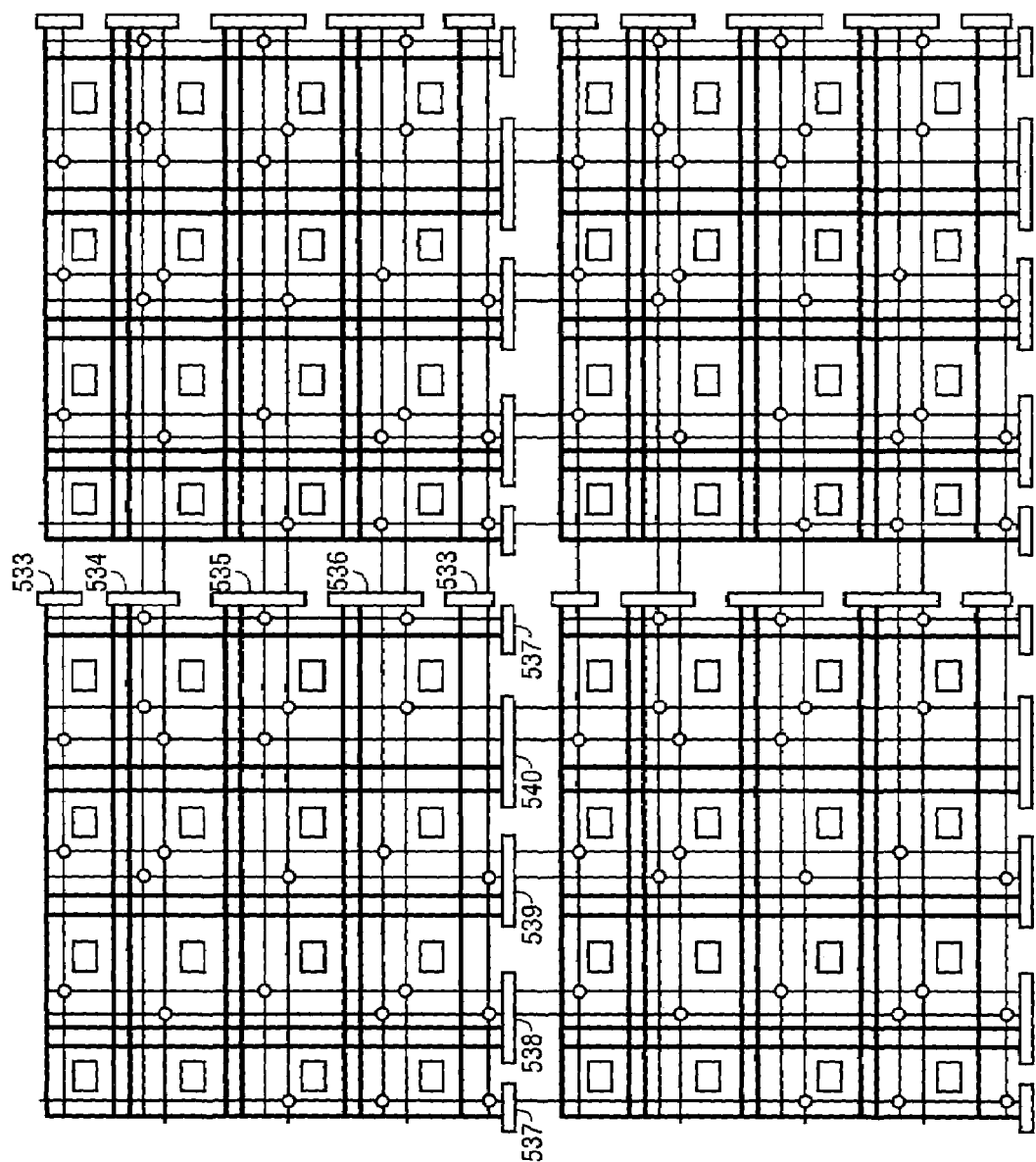
FIG. 6 shows the routing network for a block cluster.

FIG. 6 shows the routing network for a block cluster. The block cluster is basically comprised of four logical blocks which can be interconnected by the level 1 MLA exchange networks 533–540. It can be seen that there are thirty-two level 1 MLA routing network lines.

Figure 7A:
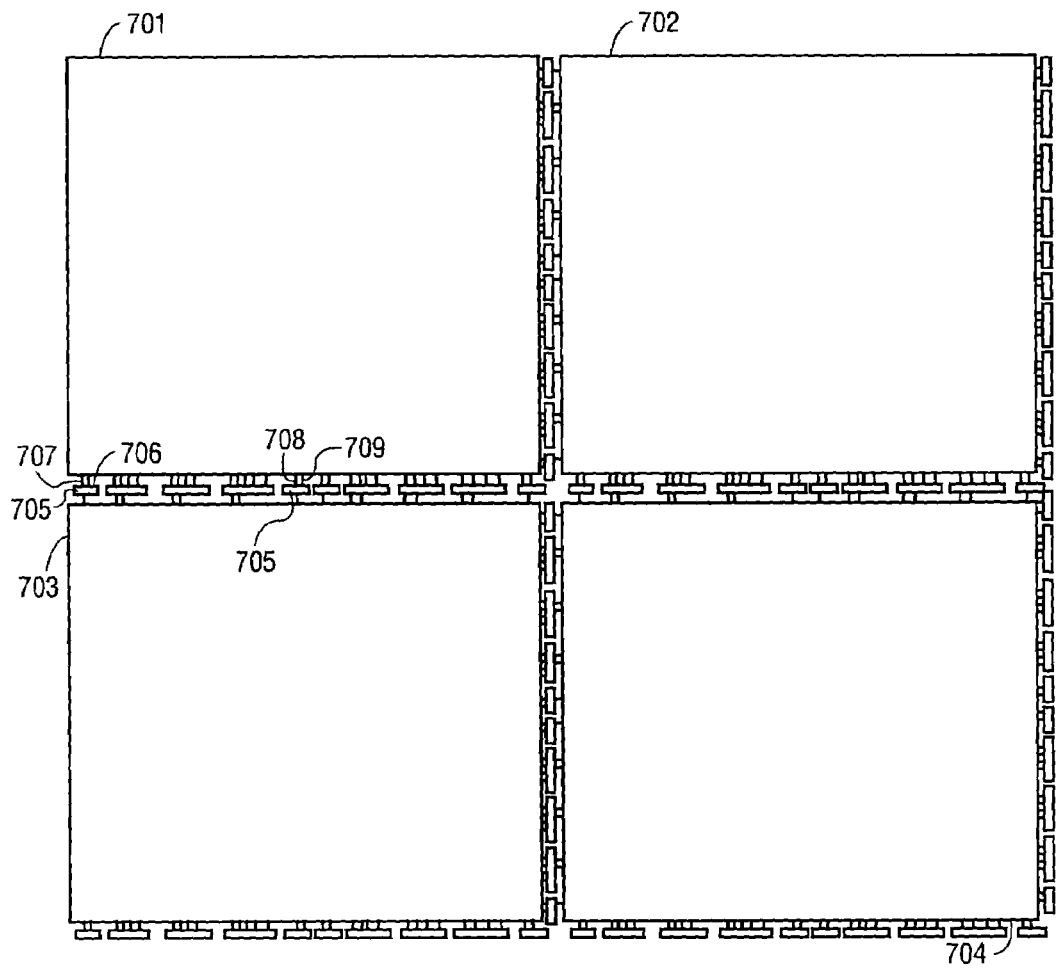
FIG. 7A shows the block diagram of a block sector.

FIG. 7A shows the block diagram for a block sector. The block sector is comprised of four block clusters 701–704. As discussed above, the block clusters are interconnected by block connectors and level 1 MLA routing network lines. In addition, the block sector is also comprised of sixty-four level 2 MLA routing network lines and sixty-four level 2 to level 1 exchange networks to provide connectability between level 1 MLA routing network and level 2 MLA routing network. The level 1 to level 2 MLA routing exchange networks are depicted by rectangles in FIG. 7A. Furthermore, there are forty-eight level 2 MLA turn points associated with each of the four logical blocks within the block sector. Consequently, there are one hundred and ninety-two level 2 MLA turn points for the block sector.

Figure 7B:
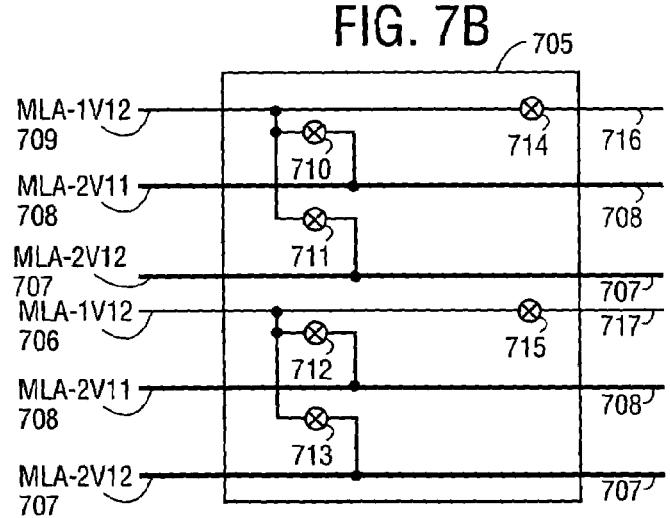
FIG. 7B shows a level 1 to level 2 MLA routing exchange network.

FIG. 7B shows a sample level 1 to level 2 MLA routing exchange network 705. It can be seen that switch 710 is used to control whether a signal should pass between level 1 MLA line 709 and level 2 MLA line 708. Switch 711 is used to control whether a signal should pass between level 1 MLA line 709 and level 2 MLA line 707. Switch 712 is used to control whether a signal should pass between level 1 MLA line 706 and level 2 MLA line 708. Switch 713 is used to control whether a signal should pass between level 1 MLA line 706 and level 2 MLA line 707. Switch 714 is used to control whether a signal should pass form one level 1 MLA line 709 to the adjacent level 1 MLA line 716 belonging to the adjacent block cluster. Likewise, switch 715 is used to control whether a signal should pass form one level 1 MLA line 706 to the adjacent level 1 MLA line 715 belonging to the adjacent block cluster.

Figure 8A:
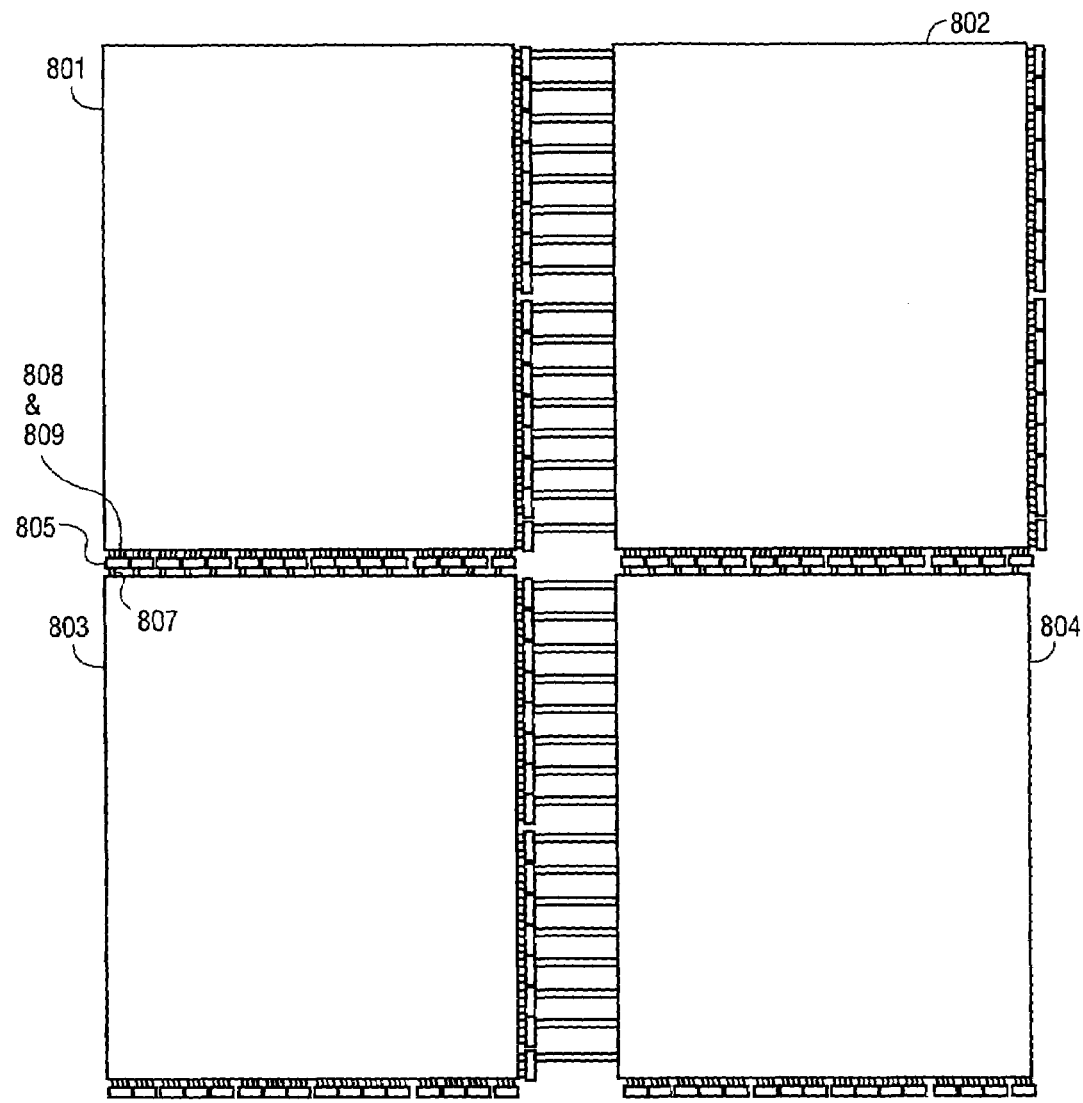
FIG. 8A shows a sector cluster.

FIG. 8A shows a sector cluster. The sector cluster is comprised of four block sectors 801–804 with their associated block connectors, level 1 , and level 2 MLA routing network lines and exchange networks. In addition, there are one hundred and twenty-eight level 3 MLA routing network lines, providing connectability between the level 2 MLA lines that belong to different block sectors 801–804 within the same sector cluster 800. There are ninety-six level 3

MLA turn points associated with the level 3 MLA lines for each of the block sector 801–804 (i.e. three hundred and eighty-four total level 3 MLA turn points for the sector cluster). Furthermore, there are thirty-two level 2 to level 3 MLA routing exchange networks associated with each of the four block sector 801–804. Hence, there are total of one hundred and twenty-eight level 3 MLA routing exchange network for providing programmable connectability between the various level 2 and level 3 MLA lines.

Figure 8B:
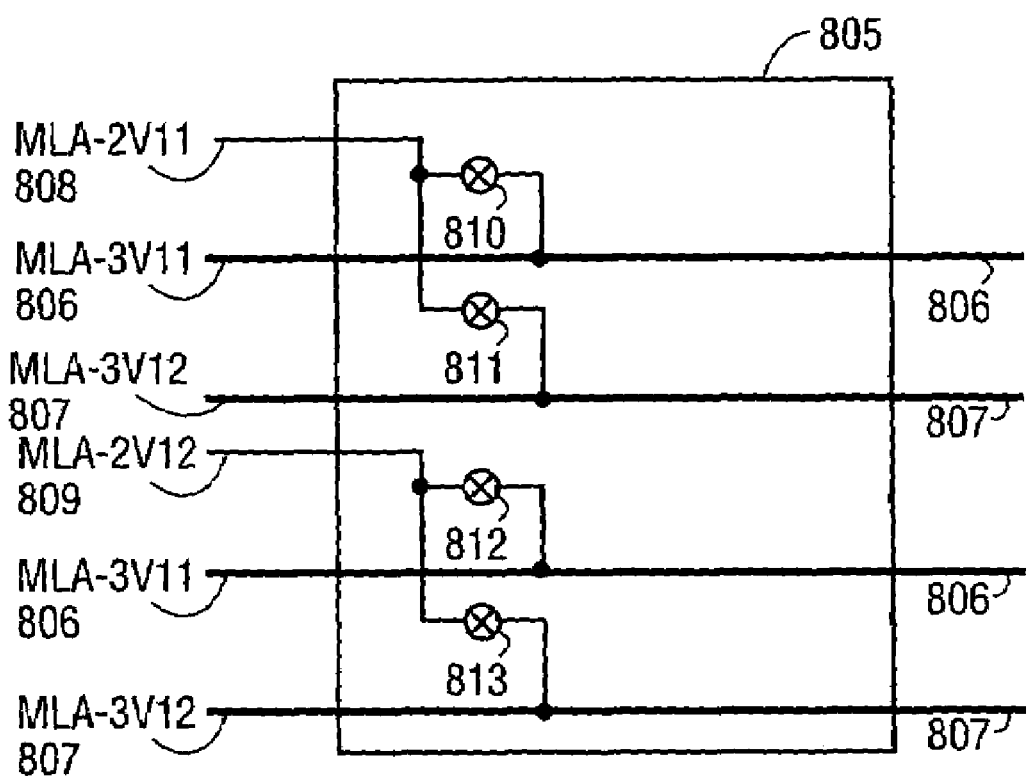
FIG. 8B shows a level 2 to level 3 MLA routing exchange network.

FIG. 8B shows an example of a level 2 to level 3 MLA routing exchange network 805. It can be seen that enabling switch 810 causes a signal on the level 2 MLA line 808 to be connected to the level 3 MLA line 806. Disabling switch 810 disconnects the level 2 MLA line 808 from the level 3 MLA line 806. Enabling switch 811 causes a signal on the level 2 MLA line 808 to be connected to the level 3 MLA line 807. Disabling switch 811 disconnects the level 2 MLA line 808 from the level 3 MLA line 807. Likewise, enabling switch 812 causes a signal on the level 2 MLA line 809 to be connected to the level 3 MLA line 806. Disabling switch 812 disconnects the level 2 MLA line 809 from the level 3 MLA line 806. Enabling switch 813 causes a signal on the level 2 MLA line 809 to be connected to the level 3 MLA line 807. Disabling switch 813 disconnects the level 2 MLA line 809 from the level 3 MLA line 807.

In the present invention, larger and more powerful FPGAs can be achieved by adding additional logic sector clusters which are connected by additional levels of MLA routing networks with the corresponding MLA turn points and exchange networks.

In one embodiment of the present invention, each of the five I-Matrix lines (331–335, FIG. 3A) can be extended to provide connectability between two adjacent I-Matrix lines belonging to two different clusters. The passgate switches 336–340, 341–345, 346–350, and 351–355 in FIG. 3B are examples of four different sets of I-Matrix line extension switches. This provides further flexibility by providing the capability of routing a signal between two adjacent clusters without having to be routed through the use of block connectors.

Similarly, block connectors can be extended to provide connectability between two adjacent block connectors belonging to two different logical blocks. Switch 573 of FIG. 5C illustrates such block connector extension connecting block connector 501 to block connector 584 through switch 573. This provides further flexibility by providing the capability of routing a signal between two adjacent logical blocks without having to be routed through the level 1 MLA lines and associated MLA exchange networks. This concept can be similarly applied to the level 1 MLA lines as well. Switch 714 of FIG. 7B shows an example where level 1 MLA line 709 is extended to connect to level 1 MLA line 716 by enabling switch 714. This provides further flexibility by providing the capability of routing a signal between two adjacent block clusters without having to be routed through the level 2 MLA lines and associated MLA exchange networks.

Figure 9:
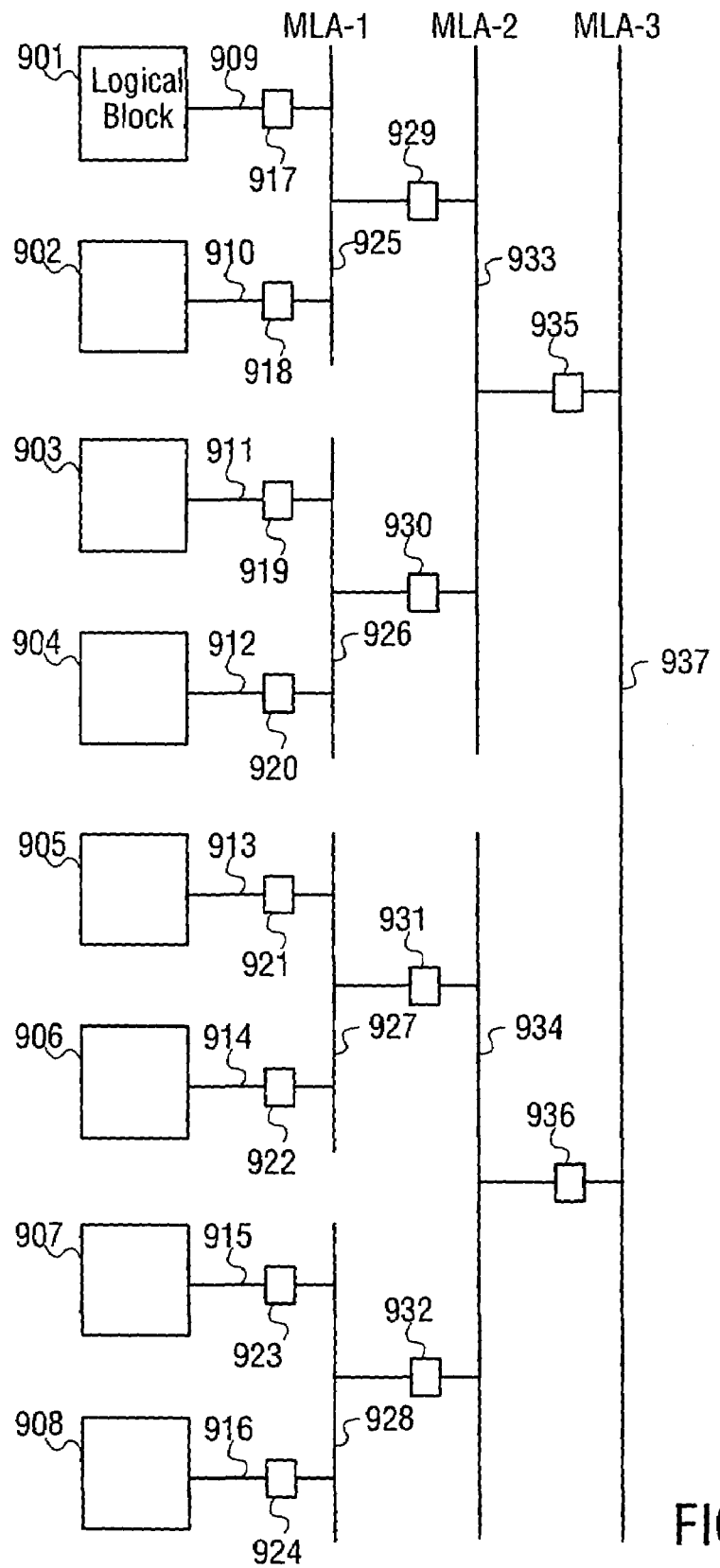
FIG. 9 shows one embodiment of a hierarchical multiple level routing network for providing routability between the logical blocks and the MLA levels.

FIG. 9 shows one embodiment of a hierarchical multiple level routing network for providing routability between the logical blocks and the MLA levels. Eight logical blocks 901–908 are shown. Associated with each of the logical blocks 901–908 are a plurality of block connectors. In the currently preferred embodiment, there are eight horizontal and eight vertical block connectors associated with each of the logical blocks 901–908. For clarity and ease of comprehension, the block connectors corresponding to an individual logical block is represented by a single line (e.g., block connectors 909–916 respectively correspond to logical blocks 901–908) and only the horizontal block connectors are shown.

In turn, each of the block connectors 909–916 are respectively coupled to programmable bi-directional drivers 917–924. Consequently, block connectors 909–916 can be programmed to be coupled bi-directionally to the MLA-1 lines 925–928. For example, exchange network 917 can be programmed to couple one of the block connectors 909 of logical block 901 to the MLA-1 line 925. Additional programmable bi-directional drivers 929–932 are used to provide interconnections between the MLA-1 lines 925–928 and the next MLA level MLA-2 lines 933–934. Programmable bi-directional drivers 935–936 selectively provide interconnections between the MLA-2 lines 933–934 and the MLA-3 line 937. This hierarchical interconnection scheme can be repeated for additional multiple MLA levels.

Figure 10:
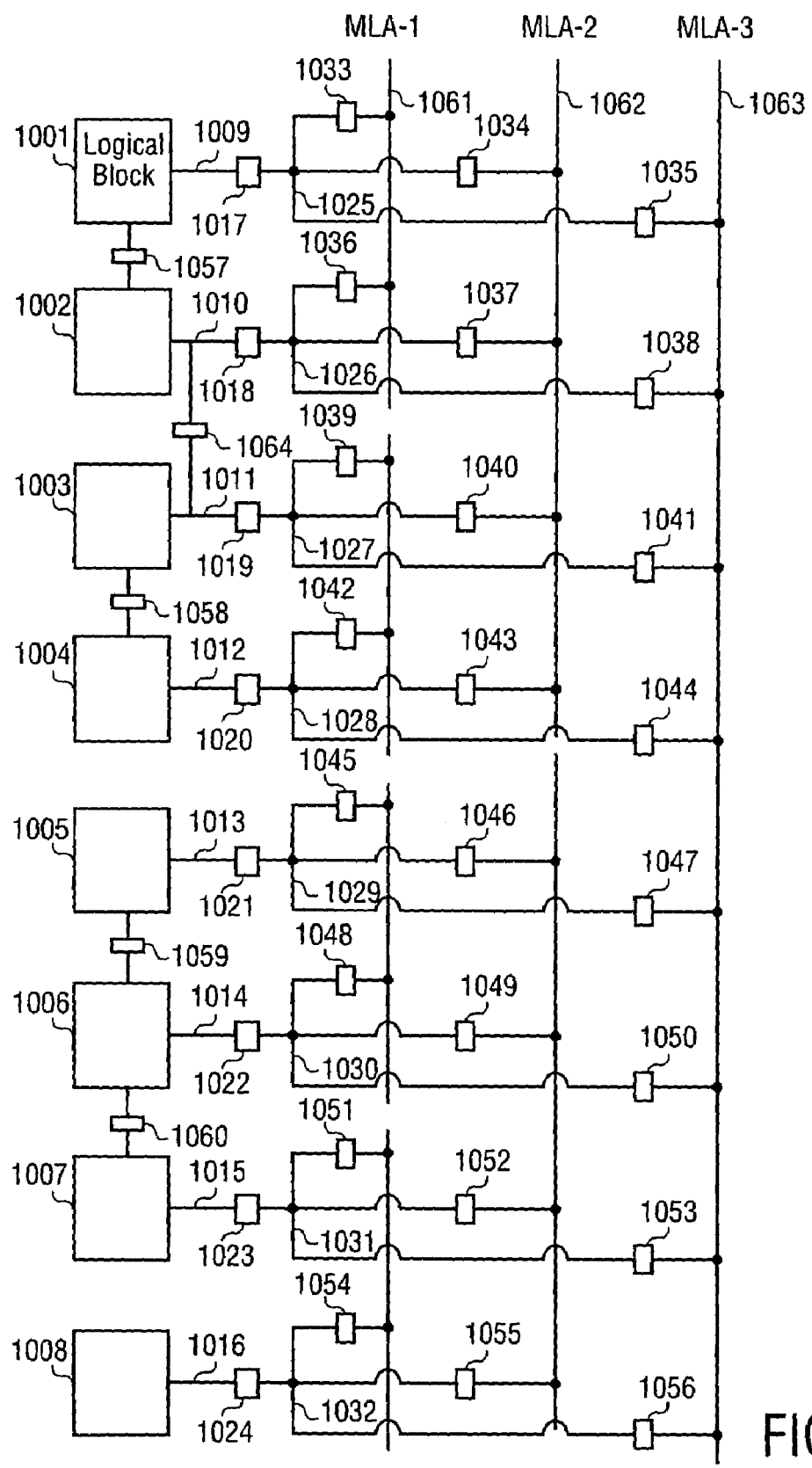
FIG. 10 shows another embodiment of a hierarchical multiple level routing network for providing routability between the logical blocks and the MLA levels.

FIG. 10 shows another embodiment of a hierarchical multiple level routing network for providing routability between the logical blocks and the MLA levels. This embodiment is similar to the routing network shown in FIG. 9, except that the block connectors can be directly connected to any of the MLA levels and bypassing any intervening MLA level. Eight logical blocks 1001–1008 are shown. Associated with each logical block are a plurality of block connectors 1009–1016. Programmable bi-directional drivers 1017–1024 are used to selectively couple the block connectors 1009–1016 to the block connector tabs 1025–1032. The block connector tabs 1025–1032 are used as junction points from which connections can be made to multiple MLA layers. Programmable bi-directional driver sets (1033–1035), (1036–1038), (1039–1041), (1042–1044), (1045–1047), (1048–1050), (1051–1053), (1054–1056), correspond to block connector tabs 1025–1032, respectively. Each of these driver sets enables their respective logical block to be connected to either the MLA-1 line 1061, MLA-2 line 1062, or MLA-3 line 1063 without requiring it to pass through any intervening MLA lines. For example, logical block 1001 can be connected to the MLA-1 line 1061 by selectively activating drivers 1017 and 1033. Logical block 1001 can also be connected to the MLA-2 line 1062 by selectively activating drivers 1017 and 1034. Note that in this embodiment, logical block 1001 can be connected to the MLA-2 line 1062 without having to first be connected to the MLA-1 line 1061. Furthermore, logical block 1001 can be connected to the MLA-3 line 1063 by selectively activating drivers 1017 and 1035. Note that in this embodiment, logical block 1001 need not be connected to either the MLA-1 nor the MLA-2 layers in order for it to be connected to the MLA-3 layer. By directly connecting the logical block to the desired MLA layer, the speed of the overall routing network is improved. Furthermore, speed and routing flexibility can be enhanced by directly connecting two or more adjacent logical blocks. Thereby, adjacent logical blocks can communicate without having to be routed over any of the MLA layers. For example, logical blocks 1001 and 1002 can be connected together via the programmable bi-directional driver 1057; logical blocks 1003 and 1004 can be connected via driver 1058; and logical blocks 1005–1007 can be connected via drivers 1059–1060. This hierarchical routing scheme can readily be any number of logical blocks and MLA layers. In addition, a passgate 1064 can be included to couple block connector 1010 corresponding to logic block 1002 to block connector 1011 corresponding to logic block 1003.

Figure 11:
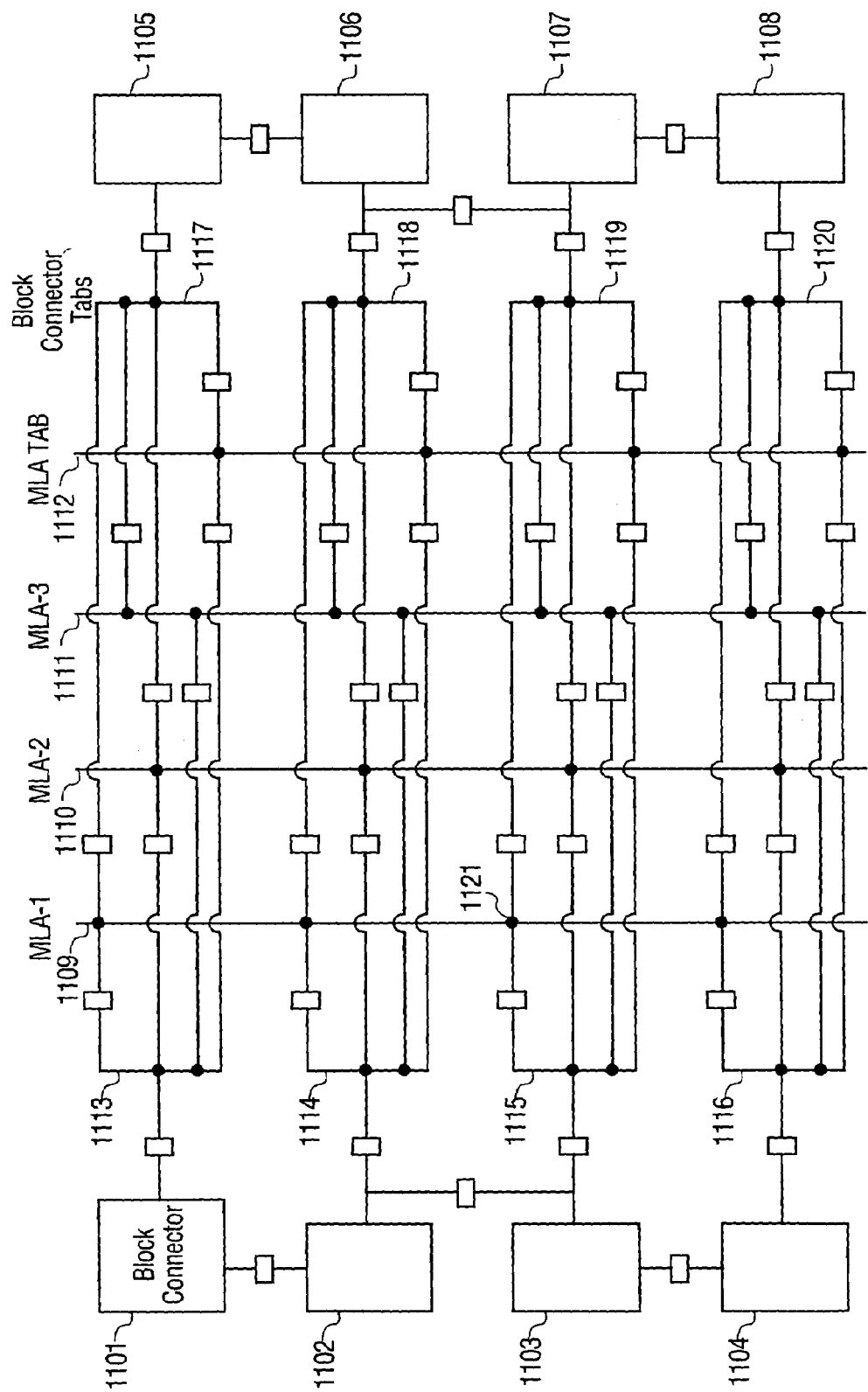
FIG. 11 shows a block diagram of one embodiment of the hierarchical routing network wherein two groups of block connectors access the same MLA lines.

FIG. 11 shows a block diagram of one embodiment of the hierarchical routing network wherein two groups of block connectors access the same MLA lines. A first group of logical blocks 1101–1104 and a second group of logical blocks 1105-1108 are shown. The first group of logical blocks 1101–1104 can be selectively connected to the MLA-1 layer 1109 and 1121, MLA-2 layer 1110, MLA-3 layer 1111, and MLA Tab 1112 via block connector tabs 1113–1116. Similarly, the second group of logical blocks 1105–1108 can be selectively connected to the MLA-1 layer 1109 and 1121, MLA-2 layer 1110, MLA-3 layer 1111, and MLA Tab 1112 via their respective block connector tabs 1117–1120.

Figure 12A:
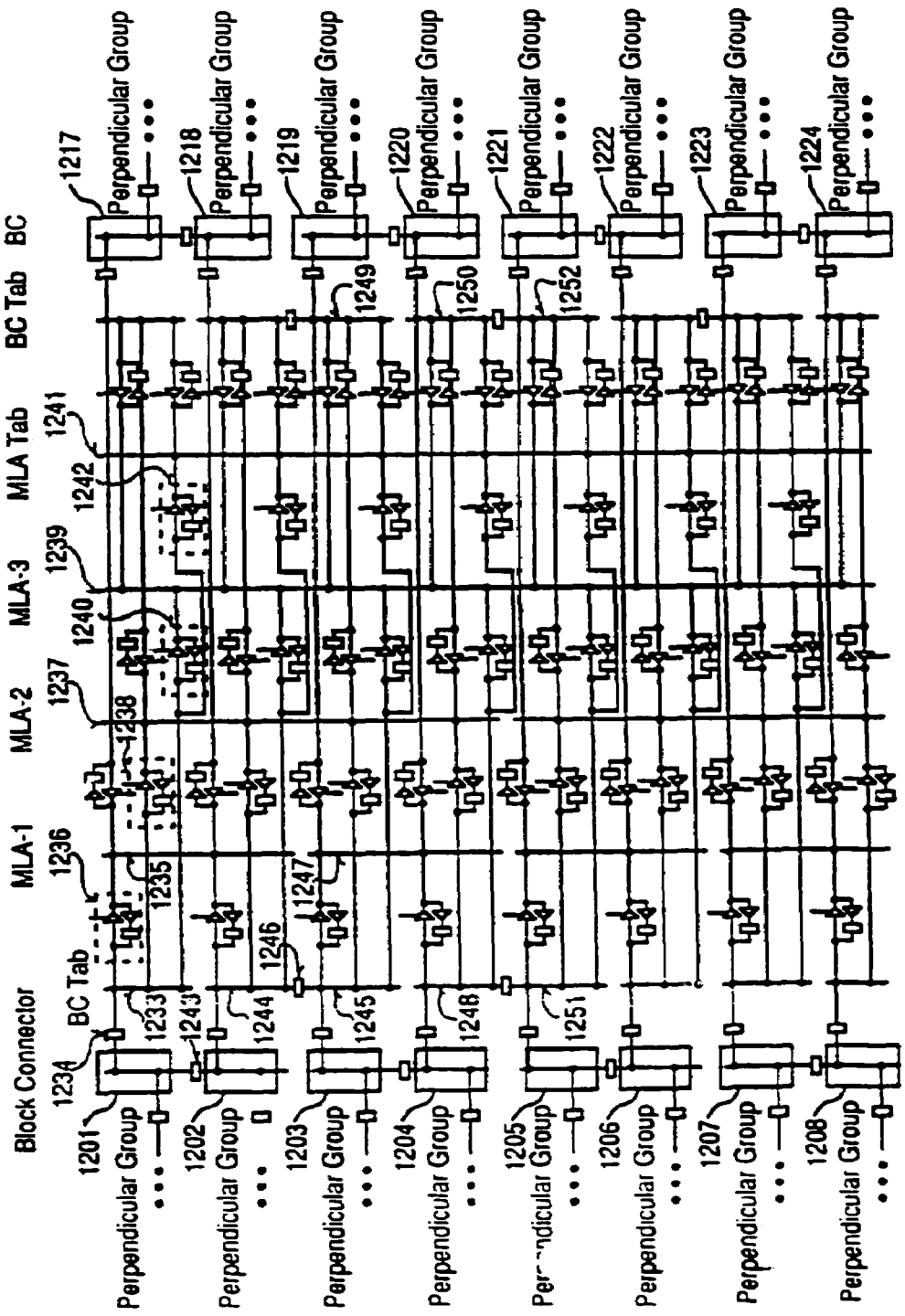
FIG. 12A and FIG. 12B show a block diagram of part of the multiple level routing network which encompasses Block Connectors to the MLA-3 Level with MLA Tabs for higher levels of routing networks.
Figure 12B:
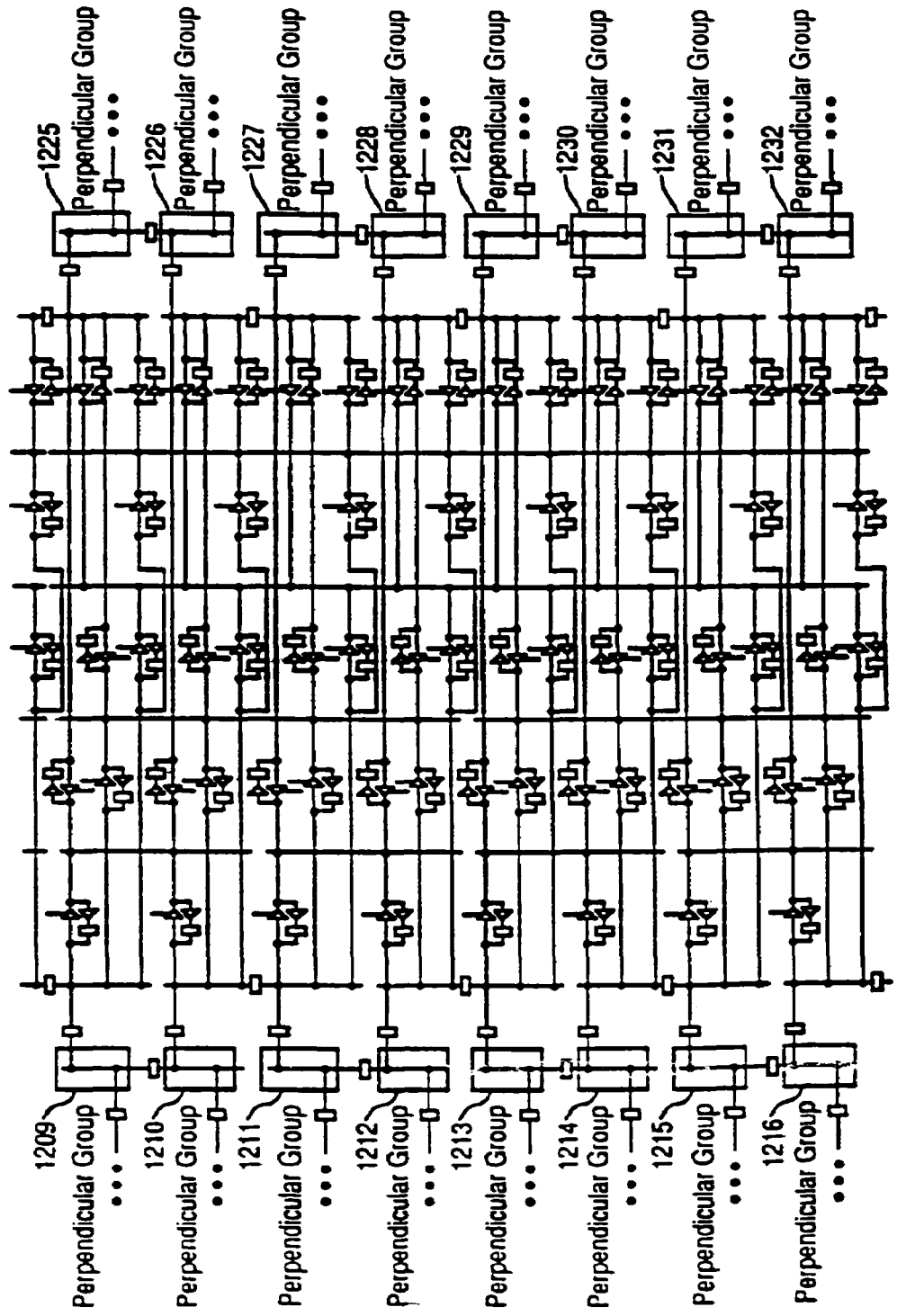

FIG. 12A and FIG. 12B show a block diagram of part of the multiple level routing network which encompasses Block Connectors to the MLA-3 Level with MLA Tabs for higher levels of routing network (the I-Matrix is not shown). FIG. 12A and FIG. 12B show the interconnections of one set of Block Connectors and its corresponding higher levels of MLAs in the horizontal direction. There is also a corresponding perpendicular (e.g., vertical) group of routing network interconnecting the Block Connectors and the associated MLAs. This perpendicular group is not shown in FIG. 12A and FIG. 12B in order to avoid obscuring the present invention. Note that there is a corresponding copy of the routing network for each and every Block Connector and associated MLAs of the FPGA.

Shown in FIG. 12A and FIG. 12B are thirty-two blocks 1201–1232. Each block is associated with a distinct and adjacent block along with two BC tabs (e.g., one horizontal and one vertical). Each of the Block Connectors 1201–1232 are couple to two selectable BC Tabs via a programmable switch. For example, block connector 1201 is coupled to selectable BC Tab 1233 through programmable switch 1234. The second group is not shown. A similar BC Tab interconnection scheme exists for block connectors 1217–1232 (both horizontally and vertically). For each BC Tab, there are bidirectional programmable drivers connectable to the MLA-1 routing lines. For example. BC Tab 1233 is selectively connectable to the MLA-1 routing line 1235 via drivers 1236. These drivers can either be parallel to or perpendicular to the corresponding BC Tabs. In the currently preferred embodiment, the number of MLA-1 lines is half the number of Block Connectors, since for each Block Connector, there is a corresponding MLA-1 line plus another MLA-1 line which is perpendicular to the first MLA-1 line. Each MLA-1 line is connectable through programmable means to the corresponding Block Connector. MLA-2 and MLA-3 lines through their corresponding BC Tab. Note that the MLA-1 routing network together with I-Matrix lines and Block Connectors form the routing resources in a 2×2 Block area. This format enhances more complex logic function formation accessing and interconnecting the cells. Furthermore. the MLA-1 routing network, in addition to both I-Matrix lines and Block Connectors. become additional hi-directionally programmable access lines that can serve as access ports for the implementation of even more complex logic functions through connections by other MLA lines or Block Connectors from outside of the 2×2 Block area. By using programmable switches, the I-Matrix lines and block connectors which are not necessarily adjacent or congruent to the 2×2 Block areas can be selectively accessed. Hence, the total number of routing segments including I-Matrix lines. Block connectors, and MLA-1 lines grow geometrically when the growth is from a Block to 2×2 Blocks.

For each BC Tab, there is bi-directionally programmable drivers connectable to the MLA-2 routing lines. For example, block connector tab 1233 is connectable to the MLA-2 line 1237 via drivers 1238. The MLA-2 can either be parallel to or perpendicular to the corresponding BC Tabs. In the currently preferred embodiment, the number of MLA-2 lines is half the number of MLA-1 lines. Each MLA-2 line is connectable through programmable means to the corresponding Block Connector, MLA-1, and MLA-3 lines through the corresponding BC Tab. The MLA-2 routing network together with I-Matrix lines, Block Connectors and MLA-1 routing network form the routing resources in a 4×4 Block area for more complex logic function formation accessing and for interconnecting the cells. In this case, the MLA-2 routing network, in conjunction with the I-Matrix lines, Block Connectors and MLA-1 lines, become additional bi-directionally programmable access lines that can serve as access ports for the implementation of even more complex logic functions through connections with other MLA lines or Block connectors from outside of the 4×4 Block area. By means of programmable switches, the access need not necessarily be adjacent or congruent to the 4×4 Block area. The total number of routing segments including I-Matrix lines, Block Connectors, MLA-1 lines, and MLA-2 lines in a 4×4 Block unit grows proportional to the increase in logic cells. The increase in the total number is geometrical when the growth is from a Block to 4×4 Blocks. Similarly, for each BC Tab, there is bi-directionally programmable drivers connectable to MLA-3 routing lines. For example, BC Tab 1233 is connectable to the MLA-3 line 1239 via drivers 1240. The MLA-3 routing line can either be parallel to or perpendicular (e.g., horizontal or vertical) to the corresponding BC Tabs. In the currently preferred embodiment, the number of MLA-3 lines is half the number of MLA-2 lines. Each MLA-3 line is connectable through programmable means to the corresponding Block Connector, MLA-1, and MLA-2 lines through the corresponding BC Tab; The MLA-3 routing network together with I-Matrix lines, Block Connectors, MLA-1 routing network and MLA-2 routing network form the routing resources in a 8×8 Block area for more complex logic function formation accessing and interconnecting the cells. The MLA-3 routing network, in addition to both I-Matrix lines, Block Connectors, MLA-1 lines and MLA-2 lines, become additional bi-directionally programmable access lines that can serve as access ports for the implementation of even more complex logic functions through connections by other MLA lines or Block Connectors that are outside of the 8×8 Block area and are not necessarily adjacent or congruent to the 8×8 Block area through programmable means. Hence, the total number of routing segment including I-Matrix lines, Block Connectors, MLA-1 lines, MLA-2 lines and MLA-3 lines in an 8×8 Block unit grows proportional to the increase in logic cells. This increase is geometrical when the growth is from a Block to 8×8 Blocks. In addition, for each BC Tab, there is bi-directionally programmable drivers connectable to MLA Tabs. For example, BC Tab 1233 is connectable to the MLA Tab 1241 via drivers 1242. The MLA Tabs can either be parallel to or perpendicular to the corresponding BC Tabs. Each bi-directionally programmable driver (e.g., driver's 1236, 1238, 1240, 1242, etc.) can be either passgate controlled through programmable means; bi-directional drivers with passgates controlled through programmable means; a tri-state controlled through programmable means in one direction and passgate or driver with a passgate controlled through programmable means; or two tri-states in opposite directions controlled through programmable means. The choice is a function of speed and density requirements.

In one embodiment, each Block Connector and BC Tab have extensions to the adjacent Blocks. For example. block

1201 is connectable to block 1202 via programmable switch 1246. It should be noted that additional extensions for MLA lines can be implemented in order to extend the routing range without having to user higher level MLA lines. Multiple variations to the routing network shown in FIG. 12A and FIG. 12B are possible. For example, to increase routing resources and hence routability, the MLA-1 routing network can be replaced by making two copies of the MLA-2 routing network. On the other hand, if the objective is to minimize the routing area, one embodiment minimizes the amount of programming bits by replacing the MLA-1 routing network with a copy of the MLA-2 routing network. These kinds of variations can be applied to a mixture of other levels. Another embodiment is to off-set one or more of the MLA lines. For example, in FIG. 12A and FIG. 12K the MLA-1 line 1247 is accessible by BC Tabs 1245, 1248, 1249, and 1250. The MLA-1 line 1247 can be shifted by one block to become accessible by BC Tabs 1248, 1251, 1250 and 1252 instead. All other MLA-1 lines can by thusly shifted. This can also be applied to other MLA level(s).

Figure 13:
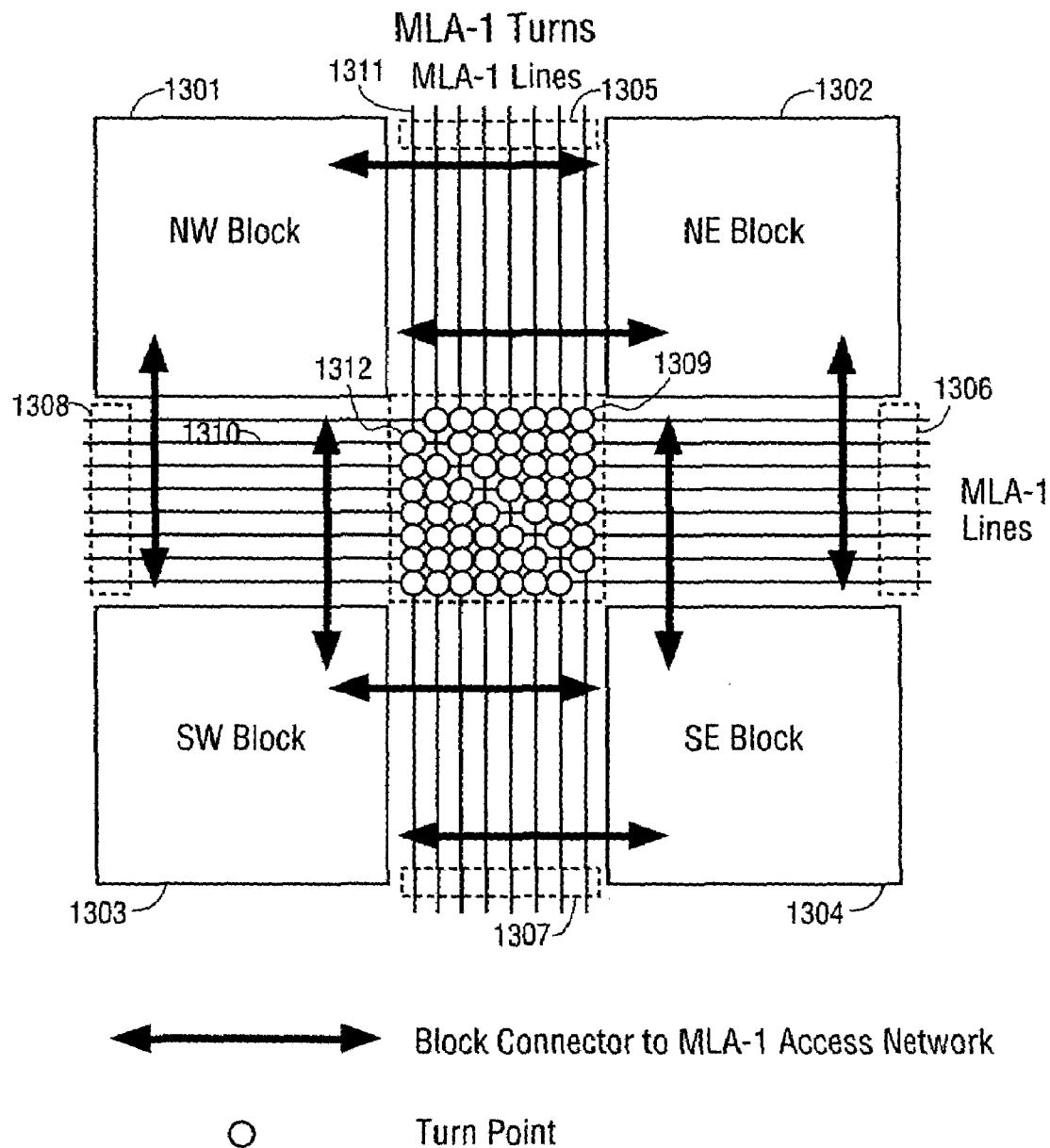
FIG. 13 shows an MLA-1 turn network.

FIG. 13 shows an MLA-1 turn network. Four logical blocks 1301–1304 are shown. These four logical blocks are connected to each of the MLA-1 lines of sets 1305–1308. Each of the MLA-1 lines is connectable through a programmable means (e.g., turn points 1309) to all the perpendicular MLA-1 lines, except the corresponding perpendicular MLA-1 line. For example, the horizontal MLA-1 line 1310 is connectable to the vertical MLA-1 line 1311 via turn point 1312. The purpose for the MLA-1 lines is to connect a set of Block Connectors together that is within the MLA-1 routing network range. In the case of connecting corresponding Block Connectors within a four-Blocks area, as shown in FIG. 13, the connection(s) can be made through either the Block Connector extension or through a BC Tab to one of the corresponding MLA-1 line, without having to resort to using two perpendicular MLA-2 lines through turn points. In one embodiment, the number of turn points is reduced. This restricts the turn flexibility but also reduces both the loading on the MLA-1 lines and the area required to lay out the design. However, routing flexibility and routability may be affected.

Figure 14:
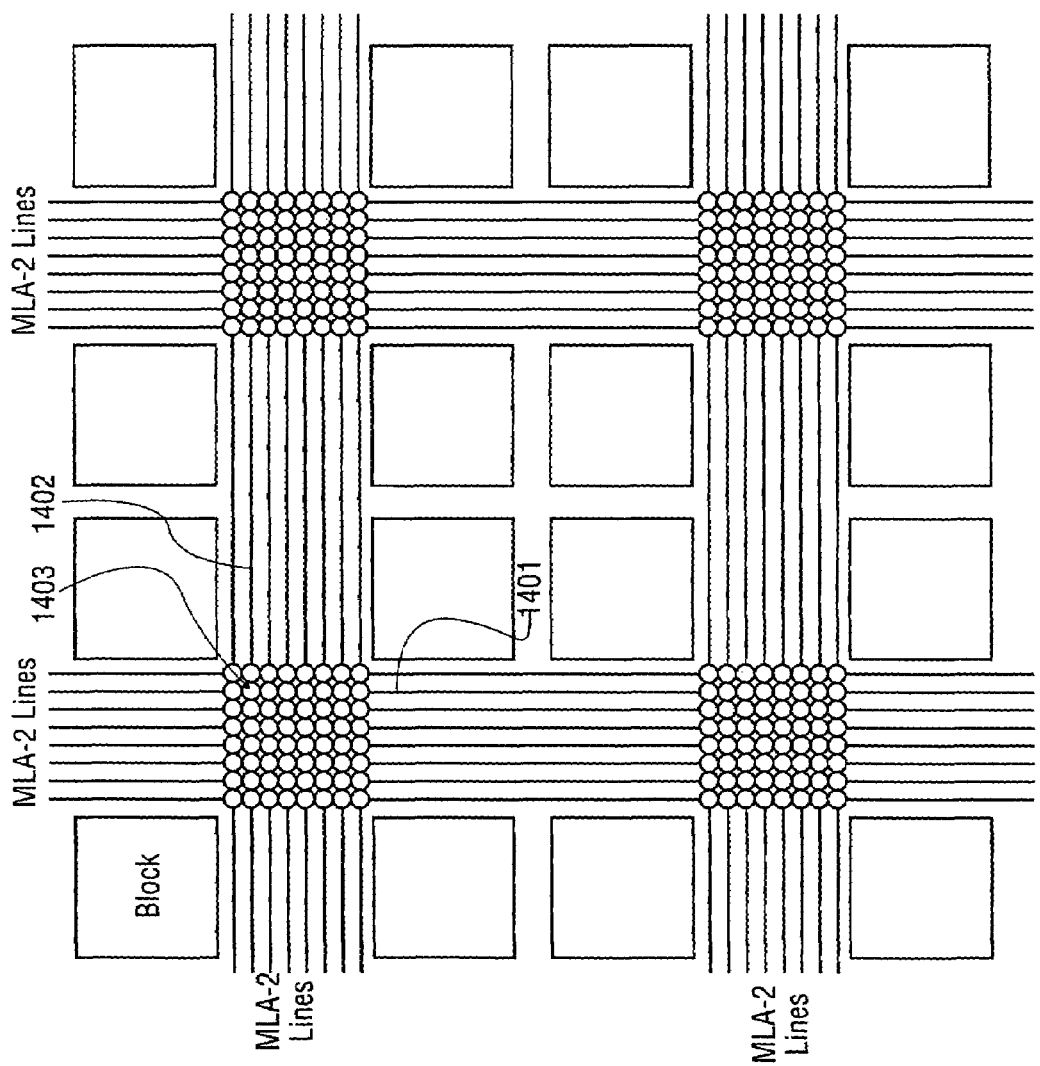
FIG. 14 shows an MLA-2 turn network.

FIG. 14 shows an MLA-2 turn network. As can be seen, each MLA-2 line is connectable through programmable means to every MLA-2 lines which are perpendicular to the MLA-2 line. For example, the vertical MLA-2 line 1401 is connectable to the horizontal MLA-2 line 1402 through turn point 1403. In other embodiments, the turn flexibility can be made more restrictive by reducing the number of turn points. This will reduce both the loading on the MLA-2 line and the area required to lay out the design. However, routing flexibility and routability may be affected.

Figure 15:
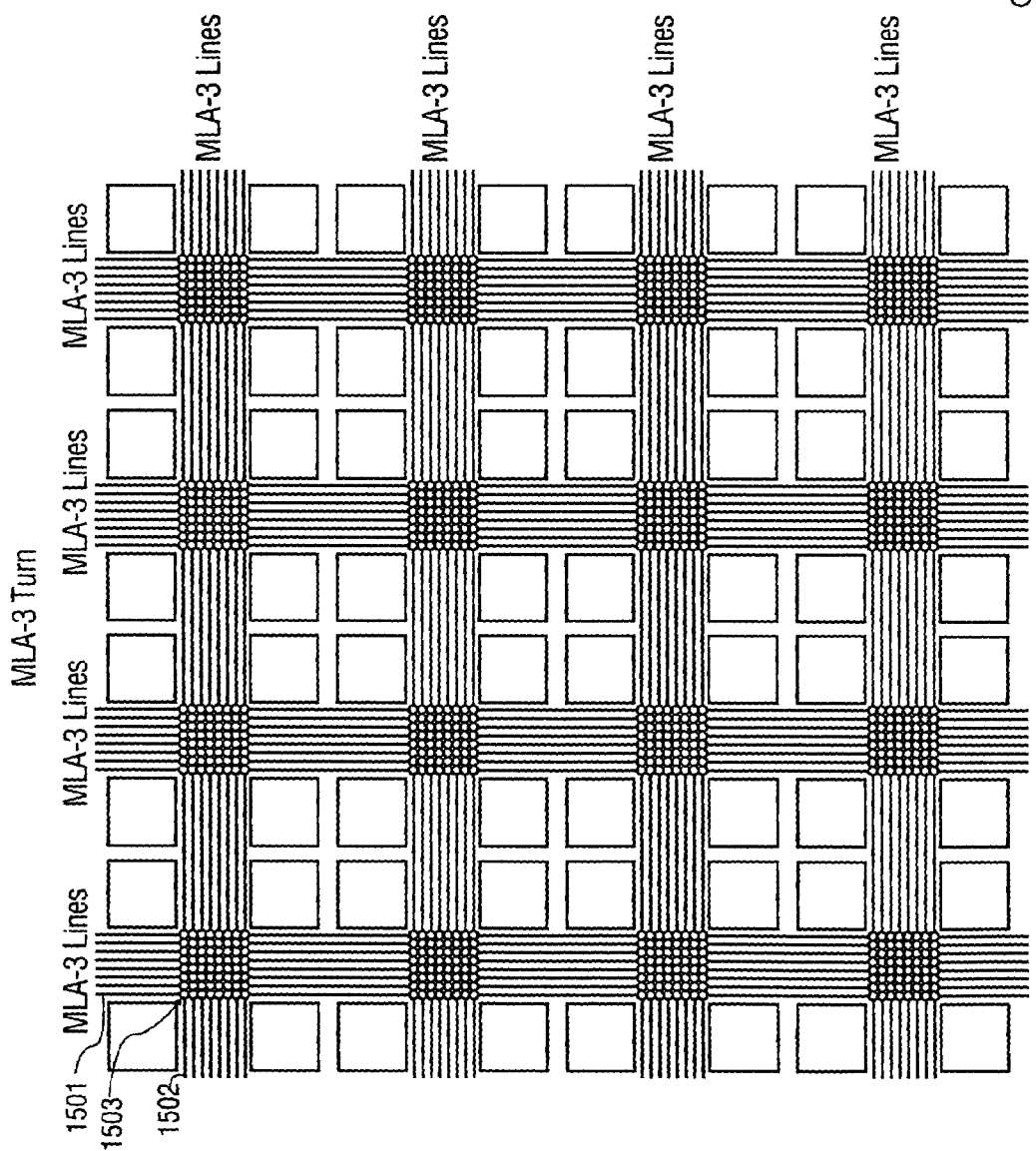
FIG. 15 shows an MLA-3 turn network.

FIG. 15 shows an MLA-3 turn network. Each MLA-3 line is connectable through programmable means to all the perpendicular MLA-3 lines. For example, the vertical MLA-3 line 1501 is connectable to the horizontal MLA-3 line 1502 through turn point 1503. The turn flexibility can be made more restrictive by reducing the number of turn points. This will reduce both the loading on the MLA-3 line and the area required to lay out the design. However, routing flexibility and routability may be affected.

Figure 16:
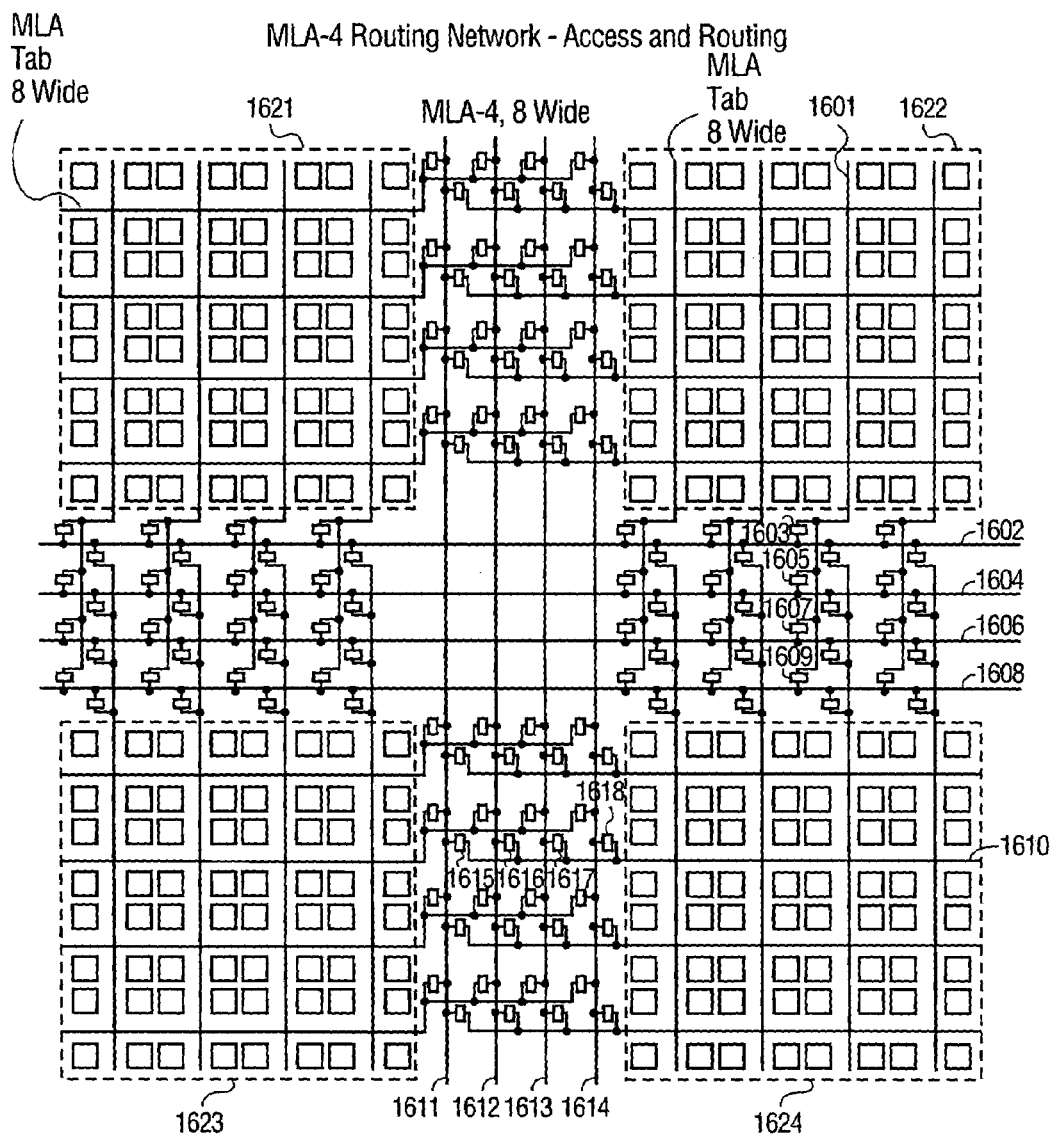
FIG. 16 shows one embodiment of a routing network for the MLA-4 layer and the mechanism whereby the MLA-4 lines are accessed.

FIG. 16 shows one embodiment of a routing network for the MLA-4 layer and the mechanism whereby the MLA-4 lines are accessed. FIG. 16 shows four 8×8 Blocks 1621–1624 (for a total of 16×16 Blocks). Associated with the four 8×8 Blocks 1621–1624 are four horizontal and four vertical groups of MLA Tabs. In the currently preferred embodiment, the MLA-4 lines and MLA Tabs are 8-bits wide. Since each Block has eight corresponding Block Connectors, each MLA Tab is shown to be eight lines wide where each of the lines corresponds to one of the 8 Block Connectors as shown earlier in FIG. 12A and FIG. 12B. In the currently preferred embodiment, there are four vertical and four horizontal MLA-4 lines, each of which is eight lines wide. Thus, the number of MLA-4 lines is one-fourth the number of MLA-3 lines. Each MLA-4 line is connectable through programmable means to the corresponding Block Connector. MLA-1, MLA-2 and MLA-3 lines. The desired connectivity is made through the corresponding MLA Tab and the BC Tabs. The MLA-4 routing network together with the I-Matrix lines. Block Connectors. MLA-1 routing network, MLA-2 routing network and MLA-3 routing network, form the routing resources in 16×16 Block area for more complex logic function formation accessing and interconnecting of the cells. In one embodiment, the MLA-4 routing network, in addition to both I-Matrix lines. Block Connectors, MLA-1 lines, and MLA-2 lines and MLA-3 lines become additional bi-directionally programmable access lines that can serve as access ports for the implementation of even more complex logic functions through connections by other MLA lines of Block Connectors from outside of 16×16 Block area through programmable means These other MLA lines or block connectors need not necessarily be adjacent or congruent to the 16×16 Block area. The total number of routing segments including I-Matrix lines, Block connectors. MLA-1 lines. MLA-2 lines. MLA-3 lines and MLA-4 lines in a 16×16 Block unit grows proportional to the increase in logic cells. The increase in size is geometrical when the growth is from a Block to 16×16 Blocks. Form each MLA Tab there is a corresponding MLA-4 lines connectable to the MLA Tab via a switch. For example. MLA Tab 1601 is connectable to MLA-4 line 1606 via switch 1607; and MLA-4 line 1608 via switch 1609. Likewise, MLA Tab 1610 is connectable through programmable means to all the corresponding MLA Tabs in all four corners through the vertical or the horizontal MLA-4 lines.

Figure 17:
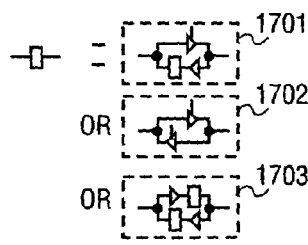
FIG. 17 shows three different switch embodiments.

FIG. 17 shows three different switch embodiments 1701–1703. In general the switch is a bi-directionally programmable driver network which can be a simple bi-directional passgate, or any of the bi-directional driver configurations 1701–1703.

Figure 18:
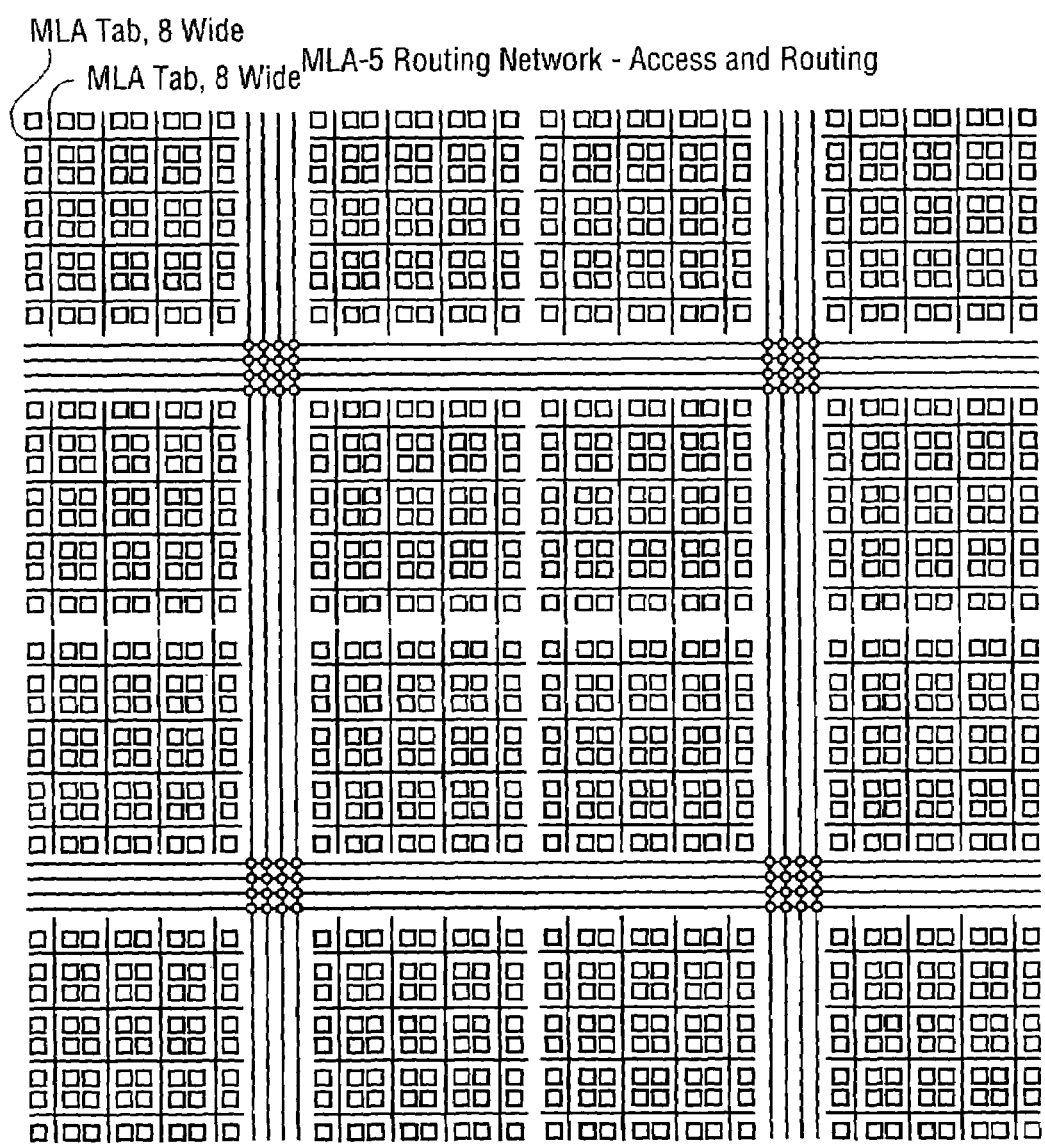
FIG. 18 shows one embodiment of a routing network for the MLA-5 layer and the mechanism whereby MLA-5 lines are accessed.

FIG. 18 shows one embodiment of a routing network for the MLA-5 layer and the mechanism whereby MLA-5 lines are accessed. Sixteen 8×8 Blocks are shown. Associated with each of the 8×8 Blocks are four horizontal and four vertical MLA Tabs, which are the same as the MLA Tabs shown in FIG. 16. When the 16×16 Blocks (as shown in FIG. 16) are grouped as a unit, the next higher level, which consists of 32×32 Blocks, is formed. Associated with each of the four 16×16 corner units are four horizontal and four vertical MLA-5 lines, each 8-bit wide. These lines are shared by the adjacent corner units, as shown in FIG. 18. Thus, the number of MLA-5 lines is half the number of MLA-4 lines. Each MLA-5 line is connectable through programmable means to the corresponding Block Connector, MLA-1, MLA-2, MLA-3 and MLA-4 lines through the corresponding MLA Tab and the BC Tab. The MLA-5 routing network together with I-Matrix lines, Block Connectors, MLA-1 routing network, MLA-2 routing network, MLA-3 routing network and MLA-4 routing network form the routing resources in a 32×32 Block area for more complex logic function formation accessing and interconnecting the cells. Furthermore, the MLA-5 routing network, in addition to both I-Matrix lines, Block Connectors, MLA-1 lines, MLA-2 lines, MLA-3 lines and MLA-4 lines can be used as additional bi-directionally programmable access lines that can serve as access ports for the implementation of even more complex logic functions through connections by other MLA lines or Block Connectors from outside of the 32×32 Block area (which need not necessarily be adjacent or congruent to the 32×32 Block area) through programmable means. The total number of routing segments including I-Matrix lines, Block Connectors, MLA-1 lines, MLA-2 lines, MLA-3 lines, MLA-4 lines and MLA-5 lines in a 32×32 Block unit grows proportional to the increase in logic cells. This increase is geometrical when the growth is from a Block to 32×32 Blocks.

From each MLA Tab there is a corresponding MLA-5 line connectable to the MLA Tab via a switch. The switch is a bi-directionally programmable driver network which can be a simple bi-directional passgate, or any of the bi-directional driver configurations as shown in FIG. 17. In addition, turn points are incorporated were the vertical MLA-5 lines intersect the horizontal MLA-5 lines through programmable means. Each MLA Tab in any one of the four corners is connectable through programmable means to all the corresponding MLA Tabs in all four corners. This is implemented by a combination of programmable connections to the vertical and the horizontal MLA-5 lines plus use of the turn points.

Higher levels of MLA networks can be developed by programmable access through the MLA Tabs or by introducing another new intermediate MLA Tabs. In such instances, the number of MLA lines is a fraction of the next lower level MLAs. The total number of routing segments including I-Matrix lines, Block Connectors, MLA-1 lines, MLA-2 lines, MLA-3 lines, MLA-4 lines, MLA-5 lines and higher levels of MLA lines, and the corresponding number of n×n Block unit grows proportional to the increase in logic cells. This increase is geometrical when the growth is from a Block to the n×n Blocks.

Thus, an architecture with an intraconnect and interconnect scheme for programmable logic circuits is disclosed.

What is claimed is:

1. An integrated circuit, comprising:
   a plurality of switches;
   a first conductor having a first span along a first dimension, the first conductor to selectively couple to at least one input of each of at least two adjacent program controlled cells through a respective first switch and second switch of the plurality of switches without requiring traversal of another conductor;
   a second conductor having a second span along the first dimension;
   a third conductor having a third span along the first dimension, the third span being different than the second span, the first conductor to selectively couple to the second conductor and the third conductor;
   a fourth conductor having a fourth span along a second dimension; and
   a fifth conductor having a fifth span along the second dimension, the fourth span being different than the fifth span, and each of the fourth conductor and the fifth conductor selectively coupled to drive the first conductor through a respective independently controlled third switch and fourth switch of the plurality of switches, and wherein each of the first, second, third, fourth and fifth conductors is neither an input nor an output of a program controlled cell.

2. The integrated circuit of claim 1, wherein each of the plurality of switches comprises at least a program controlled passgate.

3. The integrated circuit of claim 1, wherein each of the plurality of switches comprises at least a program controlled driver/receiver.

4. The integrated circuit of claim 1, wherein one of the plurality of switches comprises at least one of a program controlled passgate and a program controlled driver/receiver.

5. The integrated circuit of claim 1, wherein one of the plurality of switches has a program controlled on state and off state.

6. The integrated circuit of claim 1, wherein the integrated circuit is implemented using process technology incorporating memory devices.

7. The integrated circuit of claim 1, wherein the integrated circuit is implemented using process technology incorporating non-volatile memory devices.

8. The integrated circuit of claim 1, wherein the integrated circuit is implemented using process technology incorporating fuse devices.

9. The integrated circuit of claim 1, wherein the integrated circuit is implemented using process technology incorporating anti-fuse devices.

10. The integrated circuit of claim 1, wherein the integrated circuit is implemented using process technology incorporating Ferro-electric devices.

11. A method, comprising:
    providing a plurality of switches;
    providing a first conductor having a first span along a first dimension;
    selectively coupling the first conductor to at least one input of each of at least two adjacent program controlled cells through a respective first switch and second switch of the plurality of switches without requiring traversal of another conductor;
    providing a second conductor having a second span along the first dimension; and
    providing a third conductor having a third span along the first dimension, the third span being different than the second span;
    selectively coupling the first conductor to the second conductor and the third conductor;
    providing a fourth conductor having a fourth span along a second dimension; and
    providing a fifth conductor having a fifth span along the second dimension, the fifth span being different than the fourth span; and
    driving the first conductor using each of the fourth and the fifth conductors through a respective independently controlled third switch and fourth switch of the plurality of switches.

12. The method of claim 11, wherein each of the plurality of switches comprises at least a program controlled driver/receiver.

13. The method of claim 11, wherein one of the plurality of switches comprises at least one of a program controlled passgate and a program controlled driver/receiver.

14. The method of claim 11, wherein one of the plurality of switches has a program controlled on state and off state.

15. The method of claim 11, wherein the integrated circuit is implemented using process technology incorporating memory devices.

16. The method of claim 11, wherein the integrated circuit is implemented using process technology incorporating non-volatile memory devices.

17. The method of claim 11, wherein the integrated circuit is implemented using process technology incorporating fuse devices.

18. The method of claim 11, wherein the integrated circuit is implemented using process technology incorporating anti-fuse devices.

19. The method of claim 11, wherein the integrated circuit is implemented using process technology incorporating Ferro-electric devices.

20. An integrated circuit having a span comprising:
a first conductor and a second conductor, each having a respectively different first span and second span along a first dimension, each of the first conductor and the second conductor being neither an input nor an output of a program controlled cell, wherein the second span is greater than the first span, and wherein the second span is less than the span of the integrated circuit along the first dimension and the first span and the second span are spanning at least one common program controlled cell along the first dimension;
a third conductor and a fourth conductor, each having a respectively different third span and fourth span along a second dimension, each of the third conductor and the fourth conductor being neither an input nor an output of a program controlled cell, wherein the fourth span is greater than the third span, wherein the third span is no less than the first span, and wherein the fourth span is less than the span of the integrated circuit along the second dimension , and wherein the third span and the fourth span are spanning at least one common program controlled cell along the second dimension; and
a first switch and a second switch, the first conductor to selectively couple to the third conductor through the first switch without requiring traversal of another conductor, and the first conductor to selectively couple to the fourth conductor through the second switch without requiring traversal of another conductor.

21. The integrated circuit as set forth in claim 20, further comprising a third switch, and wherein the second conductor is configured to selectively couple to the fourth conductor through the third switch without requiring traversal of another conductor.

22. The integrated circuit as set forth in claim 20, wherein the integrated circuit consists of a core.

23. The integrated circuit as set forth in claim 20, wherein the integrated circuit consists of a core and I/O to core interfaces.

24. The integrated circuit as set forth in claim 20, wherein the integrated circuit excludes I/O logic blocks.

25. The integrated circuit as set forth in claim 20, wherein the integrated circuit excludes I/O logic blocks and I/O to core interfaces.

26. The integrated circuit as set forth in claim 20, wherein the switches comprise program controlled passgates.

27. The integrated circuit as set forth in claim 20, wherein the switches comprise program controlled drivers/receivers.

28. The integrated circuit as set forth in claim 20, wherein the switches comprise program controlled passgates and program controlled drivers/receivers.

29. The integrated circuit as set forth in claim 20, wherein at least one of the switches has a program controlled on state and off state.

30. The integrated circuit as set forth in claim 20, wherein the integrated circuit is implemented using process technology incorporating memory devices.

31. The integrated circuit as set forth in claim 20, wherein the integrated circuit is implemented using process technology incorporating non-volatile memory devices.

32. The integrated circuit as set forth in claim 20, wherein the integrated circuit is implemented using process technology incorporating fuse devices.

33. The integrated circuit as set forth in claim 20, wherein the integrated circuit is implemented using process technology incorporating anti-fuse devices.

34. The integrated circuit as set forth in claim 20, wherein the integrated circuit is implemented using process technology incorporating ferro-electric devices.

35. A method comprising:
providing a first conductor and a second conductor, each having a respectively different first span and second span along a first dimension, each of the first conductor and the second conductor being neither an input nor an output of a program controlled cell, wherein the second span is greater than the first span, wherein the second span is less than a span of the integrated circuit along the first dimension, and wherein the first span and the second span are spanning at least one common program controlled cell along the first dimension;
providing a third conductor and a fourth conductor, each having a respectively different third span and fourth span along a second dimension, each of the third conductor and the fourth conductor being neither an input nor an output of a program controlled cell, wherein the fourth span is greater than the third span, wherein the third span is no less than the first span, wherein the fourth span is less than the span of the integrated circuit along the second dimension, and wherein the third span and the fourth span are spanning at least one common program controlled cell along the second dimension; and
providing a first switch and a second switch, the first conductor to selectively couple to the third conductor through the first switch without requiring traversal of another conductor, and the first conductor to selectively couple to the fourth conductor through the second switch without requiring traversal of another conductor.

36. The method as set forth in claim 35, further comprising selectively coupling the second conductor to the fourth conductor through the third switch without requiring traversal of another conductor.

37. The method as set forth in claim 35, wherein the integrated circuit consists of a core.

38. The method as set forth in claim 35, wherein the integrated circuit consists of a core and I/O to core interfaces.

39. The method as set forth in claim 35, wherein the integrated circuit excludes I/O logic blocks.

40. The method as set forth in claim 35, wherein the integrated circuit excludes I/O logic blocks and I/O to core interfaces.

41. The integrated circuit as set forth in claim 25, wherein at least one of the first switch and the second switch consists of a single anti-fuse device.

42. The method as set forth in claim 40, wherein at least one of the first switch and the second switch consists of a single anti-fuse device.

* * * * *